(12) United States Patent
Kim et al.

(10) Patent No.: US 12,402,464 B2
(45) Date of Patent: Aug. 26, 2025

(54) DISPLAY DEVICE AND METHOD OF MANUFACTURING THE SAME

(71) Applicant: Samsung Display Co., LTD., Yongin-si (KR)

(72) Inventors: Sang Jo Kim, Yongin-si (KR); Min Woo Kim, Yongin-si (KR); Jin Wan Kim, Yongin-si (KR); Dae Ho Song, Yongin-si (KR); Jin Woo Choi, Yongin-si (KR); Su Jeong Kim, Yongin-si (KR); Young Jin Song, Yongin-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 497 days.

(21) Appl. No.: 17/559,482

(22) Filed: Dec. 22, 2021

(65) Prior Publication Data

US 2022/0352239 A1   Nov. 3, 2022

(30) Foreign Application Priority Data

Apr. 30, 2021 (KR) .................. 10-2021-0056847

(51) Int. Cl.
| | | |
|---|---|---|
| *H10H 29/14* | (2025.01) | |
| *H10H 20/01* | (2025.01) | |
| *H10H 20/80* | (2025.01) | |
| *H10H 20/851* | (2025.01) | |
| *H10H 20/856* | (2025.01) | |

(52) U.S. Cl.
CPC .......... *H10H 29/142* (2025.01); *H10H 20/01* (2025.01); *H10H 20/8512* (2025.01); *H10H 20/856* (2025.01); *H10H 20/0361* (2025.01); *H10H 20/0363* (2025.01); *H10H 20/882* (2025.01)

(58) Field of Classification Search
None
See application file for complete search history.

(56) References Cited

U.S. PATENT DOCUMENTS

| | | |
|---|---|---|
| 9,172,008 B2 | 10/2015 | Hwang et al. |
| 10,636,349 B2 | 4/2020 | Shin et al. |
| 10,816,849 B2 | 10/2020 | Lee et al. |
| 2015/0311387 A1* | 10/2015 | Heikman ............... H01L 33/10 257/98 |
| 2020/0089054 A1* | 3/2020 | Lim ................. G02F 1/133605 |
| 2020/0117046 A1* | 4/2020 | Hwang ............ G02F 1/133565 |
| 2022/0149250 A1* | 5/2022 | Nordsell ............... H01L 33/60 |
| 2022/0352238 A1 | 11/2022 | Kim et al. |
| 2023/0361252 A1* | 11/2023 | Zhu ........................ H01L 33/10 |

FOREIGN PATENT DOCUMENTS

| | | |
|---|---|---|
| JP | 2020-529729 | 10/2020 |
| KR | 10-1309653 | 9/2013 |
| KR | 10-2014-0095390 | 8/2014 |
| KR | 10-1646663 | 8/2016 |
| KR | 10-2018-0079081 | 7/2018 |
| KR | 10-2018-0118488 | 10/2018 |
| KR | 10-2022-0149880 | 11/2022 |
| WO | 2019/027820 | 2/2019 |

* cited by examiner

*Primary Examiner* — Jay C Chang
(74) *Attorney, Agent, or Firm* — CANTOR COLBURN LLP

(57) ABSTRACT

A display device includes light emitting elements disposed on a substrate. The light emitting elements include an emission area and a porous area including quantum dots.

10 Claims, 15 Drawing Sheets

DISPLAY DEVICE AND METHOD OF MANUFACTURING THE SAME

CROSS-REFERENCE TO RELATED APPLICATION(S)

This application claims priority to and benefits of Korean Patent Application No. 10-2021-0056847 under 35 U.S.C. § 119, filed on Apr. 30, 2021 in the Korean Intellectual Property Office, the entire contents of which are incorporated herein by reference.

BACKGROUND

1. Technical Field

The disclosure relates to a display device and a method of manufacturing the same.

2. Description of the Related Art

In recent years, as interest in information display is increasing, research and development on display devices are continuously conducted.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

An object of the disclosure is to provide a display device and a method of manufacturing the same, which can improve light output efficiency and simplify a manufacturing process.

The objects of the disclosure is not limited to the above objects, and other objects may be clearly understood by those skilled in the art from the following description.

A display device may include light emitting elements disposed on a substrate. The light emitting elements may include an emission area and a porous area including quantum dots.

The light emitting elements may include a first semiconductor layer, a second semiconductor layer, the first semiconductor layer and the second semiconductor layer being disposed in the emission area of the light emitting elements, and an active layer disposed between the first semiconductor layer and the second semiconductor layer.

The porous area and the second semiconductor layer may include a same material.

The porous area may include nanoscale pores.

The quantum dots may be disposed in the nanoscale pores.

The porous area may include a color conversion area including the quantum dots; and a scattering area excluding the color conversion area.

The scattering area may be disposed between the emission area and the color conversion area.

The display device may further include a color filter layer disposed on the light emitting elements.

The display device may further include a reflective layer disposed between the light emitting elements.

The display device may further include a planarization layer disposed between the light emitting elements and the reflective layer.

A method of manufacturing a display device according to an embodiment may include forming a porous layer; forming a light emitting stack on the porous layer; forming light emitting elements by patterning the porous layer and the light emitting stack; and disposing quantum dots in the porous layer.

The forming of the porous layer may include forming a semiconductor layer; and forming nanoscale pores by etching the semiconductor layer.

The quantum dots may be disposed in the nanoscale pores.

The forming of the light emitting stack may include forming a first semiconductor layer; forming a second semiconductor layer on the first semiconductor layer; and forming an active layer between the first semiconductor layer and the second semiconductor layer.

The forming of the second semiconductor layer may include forming the second semiconductor layer directly on the porous layer.

The second semiconductor layer and the porous layer may be formed of a same material.

The method may further include forming a planarization layer between the light emitting elements.

The method may further include forming groove patterns between the light emitting elements by patterning the planarization layer.

The method may further include forming a reflective layer in the groove patterns.

The method may further include forming a color filter layer on the light emitting elements.

BRIEF DESCRIPTION OF THE DRAWINGS

The accompanying drawings, which are included to provide a further understanding of the disclosure, and are incorporated in and constitute a part of this specification, illustrate embodiments of the disclosure, and, together with the description, serve to explain principles of the disclosure.

DETAILED DESCRIPTION OF THE EMBODIMENTS

Figure 1:
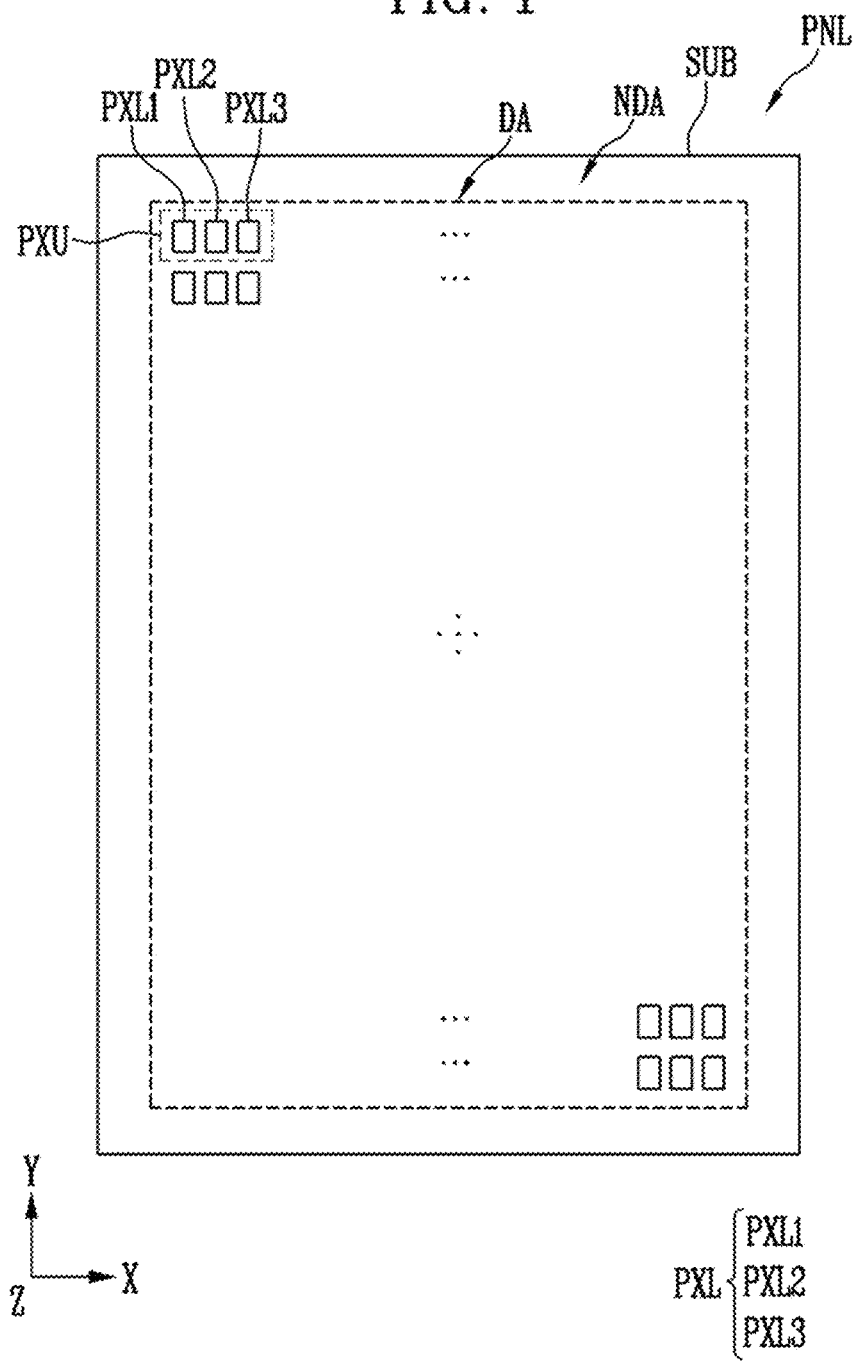
FIG. 1 is a schematic plan view illustrating a display device according to an embodiment.

Advantages and features of the disclosure, and methods for accomplishing the same will be more clearly understood from embodiments described below with reference to the accompanying drawings. However, the disclosure is not limited to the following embodiments but may be implemented in various different forms. The embodiments are provided only to complete the disclosure of the disclosure and to fully inform a person having ordinary skill in the art to which the disclosure pertains the scope of the disclosure. The disclosure may be defined by the scope of the appended claims.

The terms used in the disclosure are for describing embodiments and are not intended to limit the disclosure. In the disclosure, the singular forms are intended to include the plural forms as well, unless the context clearly indicates otherwise. For example, as used herein, the singular forms, "a," "an," and "the" are intended to include the plural forms as well, unless the context clearly indicates otherwise.

In the drawings, sizes, thicknesses, ratios, and dimensions of the elements may be exaggerated for ease of description and for clarity. Like numbers refer to like elements throughout.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

The terms "comprises," "comprising," "includes," and/or "including,", "has," "have," and/or "having," and variations thereof in case that used in this specification, specify the presence of stated features, integers, steps, operations, elements, components, and/or groups thereof, but do not preclude the presence or addition of one or more other features, integers, steps, operations, elements, components, and/or groups thereof.

The phrase "in a plan view" means viewing the object from the top, and the phrase "in a schematic cross-sectional view" means viewing a cross-section of which the object is vertically cut from the side.

In addition, the term "connection" may include not only electrical connection but also physical connection, may include direct connection as well as indirect connection through other components, or may include an integral connection or a non-integral connection.

A phrase "an element or a layer is disposed on another element or another layer" may refer to that the element may be disposed directly on another element and/or the element may be disposed indirectly on another element via another element or another layer. Like reference numerals generally refer to like elements throughout the disclosure.

Although the terms first, second, etc. may be used herein to describe various components, these components should not be limited by these terms. These terms are only used to distinguish one component from another component. Thus, a first component discussed below may be a second component within the spirit and scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

In case that an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the disclosure will be described in more detail with reference to the accompanying drawings.

FIG. 1 is a schematic plan view illustrating a display device according to an embodiment.

FIG. 1 shows a display device using a light emitting element as a light source, for example, a display panel PNL provided in the display device.

For convenience of description, FIG. 1 briefly shows a structure of the display panel PNL by focusing on a display area DA. However, according to an embodiment, at least one driving circuit unit (for example, at least one of a scan driver and a data driver), wires, and/or pads (not shown) may be further disposed on the display panel PNL.

Referring to FIG. 1, the display panel PNL may include a substrate SUB and a pixel or a pixel unit PXU disposed on the substrate SUB. The pixel unit PXU may include first pixels PXL1, second pixels PXL2, and/or third pixels PXL3. Hereinafter, in case that arbitrarily referring to at least one pixel of the first pixels PXL1, the second pixels PXL2, and the third pixels PXL3, or generically referring to two or more types of pixels, "pixel PXL" or "pixels PXL" may be used.

The substrate SUB may constitute a base member of the display panel PNL, and may be a rigid or flexible substrate or film. For example, the substrate SUB may be formed of a rigid substrate made of glass or tempered glass, or a flexible substrate (or thin film) made of plastic or metal. The material and/or physical properties of the substrate SUB are not particularly limited.

The display panel PNL and the substrate SUB for forming the same may include the display area DA for displaying an image and a non-display area NDA excluding the display area DA. Pixels PXL may be disposed in the display area DA. Various wires, pads, and/or built-in circuits connected to the pixels PXL of the display area NDA may be disposed in the non-display area NDA. The pixels PXL may be regularly arranged or disposed according to a stripe or PENTILE™ arrangement structure. However, the arrangement structure of the pixels PXL is not necessarily limited thereto. The pixels PXL may be arranged or disposed in the display area DA in various structures and/or methods.

According to an embodiment, two or more types of pixels PXL emitting light of different colors may be disposed in the display area DA. For example, the first pixels PXL1 emitting light of a first color, the second pixels PXL2 emitting light of a second color, and the third pixels PXL3 emitting light of a third color may be arranged or disposed in the display area DA. At least one of the first to third pixels PXL1, PXL2, and PXL3 adjacent to each other may constitute one pixel unit PXU capable of emitting light of various colors. For example, each of the first to third pixels PXL1, PXL2, and PXL3 may be a sub-pixel emitting light of a color. According to an embodiment, a first pixel PXL1 may be a red pixel emitting red light, a second pixel PXL2 may be a green pixel emitting green light, and a third pixel PXL3 may be a blue pixel emitting blue light, but the disclosure is not limited thereto.

In an embodiment, each of the first pixel PXL1, the second pixel PXL2, and the third pixel PXL3 may include light emitting elements emitting light of a same color, and may include a color conversion layer and/or a color filter of different colors disposed on each light emitting element to emit light of the first color, the second color, and the third color, respectively. In an embodiment, each of the first pixel PXL1, the second pixel PXL2, and the third pixel PXL3 may include a light emitting element of the first color, a light emitting element of the second color, and a light emitting element of the third color as light sources to emit light of the first color, the second color, and the third color, respectively. However, the color, type, and/or number of the pixels PXL constituting the pixel unit PXU are not particularly limited. For example, the color of the light emitted by each pixel PXL may be variously changed.

The pixel PXL may include at least one light source driven by a control signal (for example, a scan signal and a data signal) and/or a power source (for example, a first power source and a second power source). In an embodiment, the light source may include ultra-small columnar light emitting elements having a size as small as a nanometer scale to a micrometer scale. However, the disclosure is not necessarily limited thereto, and various types of light emitting elements may be used as the light source of the pixel PXL.

In an embodiment, each pixel PXL may be an active pixel. However, the types, structures, and/or driving methods of the pixels PXL applicable to the display device are not particularly limited. For example, each pixel PXL may be a pixel of a passive or active type light emitting display device having various structures and/or driving methods.

Figure 2:
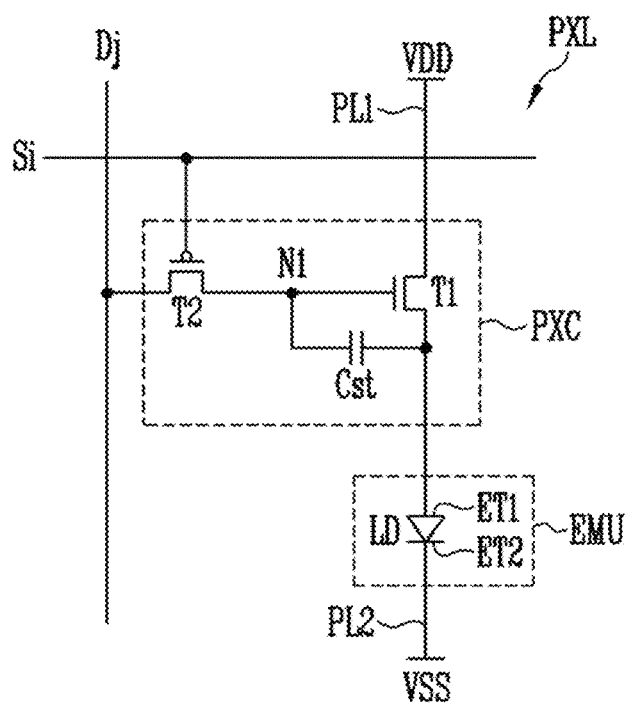
FIG. 2 is a schematic diagram of an equivalent circuit of a pixel according to an embodiment.

FIG. 2 is a schematic diagram of an equivalent circuit of a pixel according to an embodiment.

FIG. 2 shows an electrical connection relationship between components included in the pixel PXL that can be applied to an active display device. However, the types of the components included in the pixel PXL are not necessarily limited thereto.

According to an embodiment, the pixel PXL shown in FIG. 2 may be any one of the first pixel PXL1, the second pixel PXL2, and the third pixel PXL3 provided in the display panel PNL of FIG. 1. The first pixel PXL1, the second pixel PXL2, and the third pixel PXL3 may have substantially a same or similar structure to each other.

Referring to FIG. 2, the pixel PXL may include a light emitting unit EMU that generates light having a luminance corresponding to a data signal. Also, the pixel PXL may further include a pixel circuit PXC for driving the light emitting unit EMU.

According to an embodiment, the light emitting unit EMU may include at least one light emitting element LD electrically connected between a first power line PL1 to which a voltage of a first power source VDD is applied and a second power line PL2 to which a voltage of a second power source VSS is applied. For example, the light emitting unit EMU may include a first electrode ET1 connected to the first power source VDD via the pixel circuit PXC and the first power line PL1, a second electrode ET2 connected to the second power source VSS through the second power line PL2, and the light emitting element LD connected between the first electrode ET1 and the second electrode ET2. In an embodiment, the first electrode ET1 may be an anode electrode, and the second electrode ET2 may be a cathode electrode.

The light emitting element LD may include one end connected to the first power source VDD and the other end connected to the second power source VSS. According to an embodiment, one end of the light emitting element LD may be provided integrally with the first electrode ET1 to be connected to the first electrode ET1, and the other end of the light emitting element LD may be provided integrally with the second electrode ET2 to be connected to the second electrode ET2. The first power source VDD and the second power source VSS may have different potentials. A potential difference between the first and second power sources VDD and VSS may be set to be greater than or equal to a threshold voltage of the light emitting element LD during an emission period of the pixel PXL.

The light emitting element LD may constitute an effective light source of the light emitting unit EMU. The light emitting element LD may emit light with a luminance corresponding to a driving current supplied through the pixel circuit PXC. For example, during each frame period, the pixel circuit PXC may supply the driving current corresponding to a grayscale value of the corresponding frame data to the light emitting unit EMU. The driving current supplied to the light emitting unit EMU may flow through the light emitting element LD. Accordingly, the light emitting unit EMU may emit light while the light emitting element LD emits light with the luminance corresponding to the driving current.

The pixel circuit PXC may be connected to a scan line Si and a data line Dj of the pixel PXL. For example, in case that the pixel PXL is disposed in an i-th row (i may be a natural number) and a j-th column (j may be a natural number) of the display area DA, the pixel circuit PXC of the pixel PXL may be connected to an i-th scan line Si and a j-th data line Dj of the display area DA. According to an embodiment, the pixel circuit PXC may include first and second transistors T1 and T2 and a storage capacitor Cst. However, a structure of the pixel circuit PXC is not limited to the embodiment shown in FIG. 2.

The pixel circuit PXC may include the first and second transistors T1 and T2 and the storage capacitor Cst.

A first terminal of the first transistor T1 (driving transistor) may be connected to the first power source VDD, and a second terminal may be electrically connected to the light emitting element LD. A gate electrode of the first transistor T1 may be connected to a first node N1. The first transistor T1 may control the amount of driving current supplied to the light emitting element LD in response to a voltage of the first node N1.

A first terminal of the second transistor T2 (switching transistor) may be connected to the j-th data line Dj, and a second terminal may be connected to the first node N1. Here, the first terminal and the second terminal of the second transistor T2 may be different terminals. For example, in case that the first terminal is a source electrode, the second terminal may be a drain electrode. A gate electrode of the second transistor T2 may be connected to the i-th scan line Si.

The second transistor T2 may be turned on in case that a scan signal having a voltage at which the second transistor T2 can be turned on is supplied from the i-th scan line Si, and may electrically connect the j-th data line Dj and the first node N1. A data signal of a corresponding frame may be supplied to the j-th data line Dj, and accordingly, the data signal may be transferred to the first node N1. The data signal transferred to the first node N1 may be charged in the storage capacitor Cst.

The storage capacitor Cst may charge a voltage corresponding to the data signal supplied to the first node N1, and maintain the charged voltage until the data signal of the next frame is supplied.

FIG. 2 shows the pixel circuit PXC including the second transistor T2 for transferring the data signal into the pixel PXL, the storage capacitor Cst for storing the data signal, and the first transistor T1 for supplying the driving current corresponding to the data signal to the light emitting element LD. However, the disclosure is not necessarily limited thereto, and the structure of the pixel circuit PXC may be variously changed and implemented. For example, the pixel circuit PXC may further include at least one transistor element, such as a transistor element for compensating for a threshold voltage of the first transistor T1, a transistor element for initializing the first node N1, and/or a transistor element for controlling the emission time of light emitting elements LD, or other circuit elements such as a boosting capacitor for boosting the voltage of the first node N1. The first and second transistors T1 and T2 of the pixel circuit PXC may not be limited to those shown in FIG. 2, and may be variously changed to NMOS, PMOS, or the like within the spirit and the scope of the disclosure.

Figure 3:
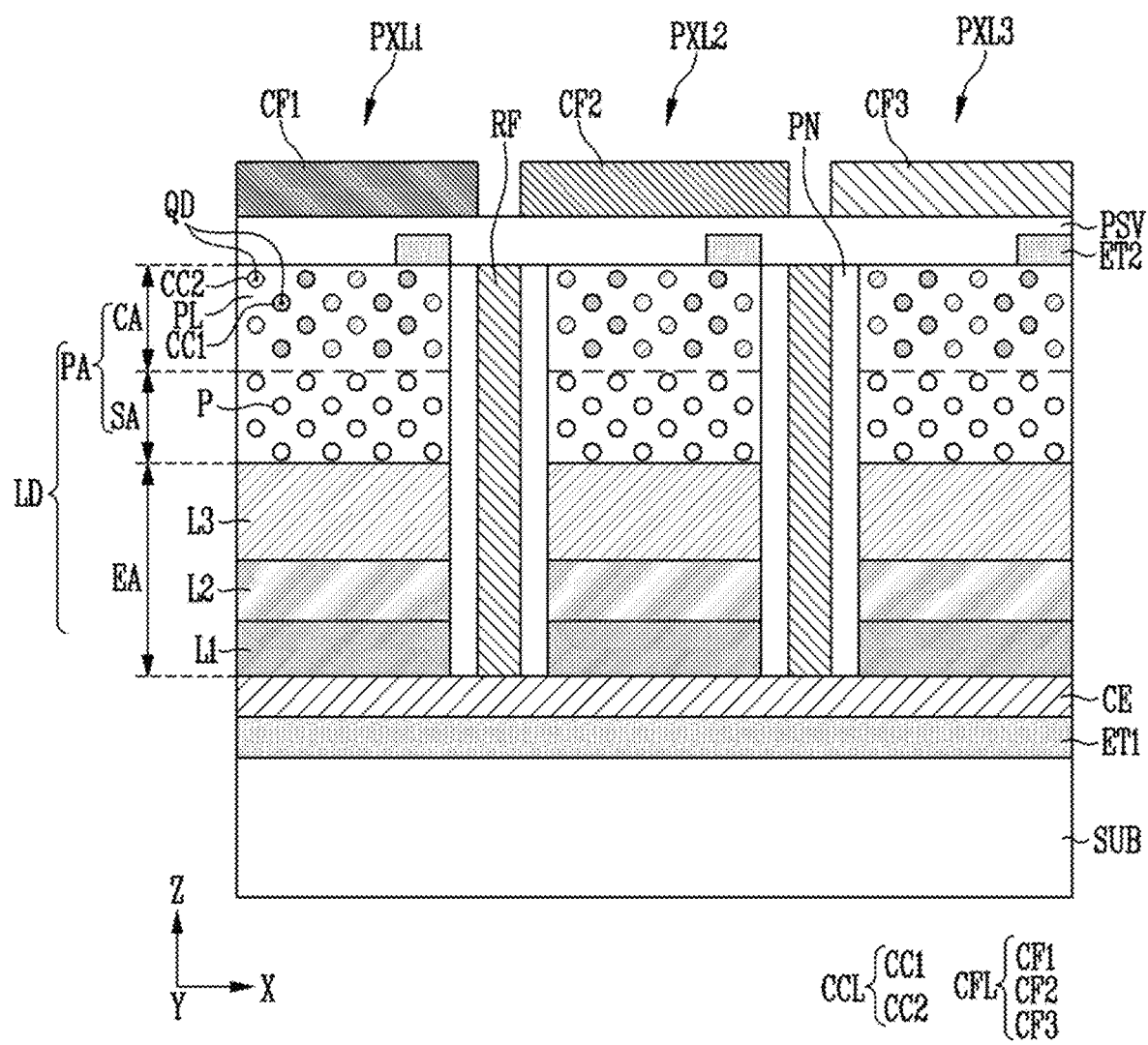
FIG. 3 is a schematic cross-sectional view illustrating the pixel according to an embodiment.

FIG. 3 is a schematic cross-sectional view illustrating the pixel according to an embodiment.

FIG. 3 schematically shows a cross-sectional structure of the first pixel PXL1, the second pixel PXL2, and the third pixel PXL3 adjacent to each other.

Referring to FIG. 3, the pixel PXL and the display device having the same may include the substrate SUB and the light emitting elements LD disposed on the substrate SUB.

The substrate SUB may be a driving substrate including circuit elements including transistors constituting the pixel circuit PXC of each pixel PXL shown in FIG. 2. For example, the substrate SUB may be the driving substrate manufactured in a wafer state. A CMOS substrate composed of a combination of NMOS and PMOS may be used as the substrate SUB, but the disclosure is not limited thereto.

The light emitting elements LD may be disposed in each of the first to third pixels PXL1, PXL2, and PXL3. Each of the light emitting elements LD may be provided in various shapes. For example, the light emitting elements LD may have a rod-like shape or bar-like shape elongated in a third direction (Z-axis direction) (for example, having an aspect ratio greater than 1), but the disclosure is not necessarily limited thereto. For example, each of the light emitting elements LD may have a pillar shape in which a diameter of one end or an end and a diameter of the other end or another end are different from each other. The light emitting elements LD may be ultra-small light emitting diodes (LED) manufactured to have a diameter and/or a length of about a nanometer scale to a micrometer scale. However, the disclosure is not necessarily limited thereto, and the size of the light emitting element LD may be variously changed to meet the requirements (or design conditions) of a lighting device or a display device to which the light emitting element LD is applied. Also, the shapes described herein may be understood to include shapes substantial to the shapes disclosed herein.

Each of the light emitting elements LD may include an emission area EA and a porous area PA. The emission area EA may be provided between the substrate SUB and the porous area PA.

The emission area EA may include a first semiconductor layer L1, a second semiconductor layer L3, and an active layer L2 interposed between the first and second semiconductor layers L1 and L3. For example, the first semiconductor layer L1, the active layer L2, and the second semiconductor layer L3 of the light emitting elements LD may be sequentially stacked each other on the substrate SUB along the third direction (Z-axis direction).

The first semiconductor layer L1 of the light emitting elements LD may include, for example, at least one p-type semiconductor layer. For example, the first semiconductor layer L1 of the light emitting elements LD may include a semiconductor material such as GaN, InGaN, InAlGaN, AlGaN, or AlN, and may include a p-type semiconductor layer doped with a first conductive dopant (or a p-type dopant) such as Mg, Zn, Ca, Sr, Ba, or the like within the spirit and the scope of the disclosure. For example, the first semiconductor layer L1 of the light emitting elements LD may include a GaN semiconductor material doped with the first conductive dopant (or the p-type dopant). However, the disclosure is not limited thereto, and various other materials may be used to form the first semiconductor layer L1 of the light emitting elements LD.

The active layer L2 of the light emitting elements LD may be disposed between the first semiconductor layer L1 and the second semiconductor layer L3. The active layer L2 of the light emitting elements LD may include any one of a single well structure, a multi well structure, a single quantum well structure, a multi quantum well (MQW) structure, a quantum dot structure, or a quantum wire structure. However, the disclosure is not necessarily limited thereto. The active layer L2 of the light emitting elements LD may include AlGaN, InGaN, or GaN, and various other materials may be used to form the active layer L2 of the light emitting elements LD.

In case that a signal (or voltage) is applied to each end of the light emitting elements LD, each light emitting element LD may emit light while electron-hole pairs are combined in the active layer L2 of the light emitting elements LD. By controlling the emission of each light emitting element LD using this principle, the light emitting element LD may be used as a light source (or light emitting source) of various light emitting devices including the pixel PXL of the display device.

According to an embodiment, an electron blocking layer EBL may be further disposed between the active layer L2 and the first semiconductor layer L1 of the light emitting elements LD. The electron blocking layer may increase recombination probability of electron-hole in the active layer L2 by blocking the flow of electrons supplied from the second semiconductor layer L3 and exited through the first semiconductor layer L1. Energy bandgap of the electron blocking layer may be larger than that of the active layer L2 and/or the first semiconductor layer L1, but the disclosure is not limited thereto.

According to an embodiment, a super lattice layer SLs may be further disposed between the active layer L2 and the second semiconductor layer L3 of the light emitting elements LD. The super lattice layer may relieve stress of the active layer L2 and the second semiconductor layer L3 to improve the quality of the light emitting elements LD. The super lattice layer may be formed in a structure in which InGaN and GaN may be alternately stacked each other, but the disclosure is not limited thereto.

The second semiconductor layer L3 of the light emitting elements LD may be disposed on the active layer L2 and may include a semiconductor layer of a different type from that of the first semiconductor layer L1. In an embodiment, the second semiconductor layer L3 of the light emitting elements LD may include at least one n-type semiconductor layer. For example, the second semiconductor layer L3 of the light emitting elements LD may include a semiconductor material such as GaN, InGaN, InAlGaN, AlGaN, or AlN, and may be an n-type semiconductor layer doped with a second conductive dopant (or an n-type dopant) such as Si, Ge, Sn, or the like within the spirit and the scope of the disclosure. For example, the second semiconductor layer L3 of the light emitting elements LD may include a GaN semiconductor material doped with the second conductive dopant (or the n-type dopant). However, the material constituting the second semiconductor layer L3 of the light emitting elements LD is not limited thereto, and various other materials may be used to form the second semiconductor layer L3 of the light emitting elements LD.

The porous area PA may be provided on the second semiconductor layer L3 of the emission area EA. For example, the porous area PA may be formed on or directly formed on the second semiconductor layer L3 of the emission area EA. The porous area PA may include a same material or similar material as the second semiconductor layer L3, but the disclosure is not limited thereto.

The porous area PA may include a porous layer PL and pores P provided in the porous layer PL. The porous layer PL may include a same material or similar material as the second semiconductor layer L3, but the disclosure is not limited thereto. For example, the porous layer PL may include at least one n-type semiconductor layer. For example, the porous layer PL may include a semiconductor material such as GaN, InGaN, InAlGaN, AlGaN, or AlN, and may be an n-type semiconductor layer doped with the second conductive dopant (or the n-type dopant) such as Si, Ge, Sn, or the like within the spirit and the scope of the disclosure. For example, the porous layer PL may include a GaN semiconductor material doped with the second conductive dopant (or the n-type dopant). However, the material constituting the porous layer PL is not limited thereto, and various other materials may be used to form the porous layer PL. The pores P may be nano-scale pores P formed through an electrochemical etching method, but the disclosure is not limited thereto. A detailed description thereof will be described later with reference to FIGS. 5 and 6.

The porous area PA may include a scattering area SA and a color conversion area CA. In an embodiment, the size and shape of the pores P formed in the scattering area SA and the color conversion area CA may be variously controlled. For example, the size of the pores P formed in the scattering area SA may be smaller than the size of the pores P formed in the color conversion area CA, but the disclosure is not limited thereto.

The scattering area SA may be provided on the emission area EA, and may scatter the light emitted from the emission area EA to improve light output efficiency. For example, since the refractive index in the scattering area SA is reduced by the pores P, light extraction efficiency can be increased. As such, in case that the scattering area SA is embedded in the porous area PA of the light emitting elements LD, since a scattering layer separately provided in the pixel PXL may be omitted, a manufacturing process can be simplified and a manufacturing cost can be reduced. The scattering area SA may be provided between the emission area EA and the color conversion area CA, and may effectively prevent a color conversion layer CCL provided in the color conversion area CA from being damaged by heat generated in the emission area EA.

The color conversion layer CCL may be provided in the color conversion area CA. For example, the color conversion layer CCL may be provided in the pores P of the color conversion area CA. As such, in case that the color conversion layer CCL is provided in the porous area PA of the light emitting elements LD, for example the color conversion area CA, the color conversion layer separately provided on the light emitting elements LD can be omitted. Accordingly, since a barrier rib structure provided at a boundary of the pixels PXL to form the color conversion layer may be omitted, a manufacturing process can be simplified and a display device having an ultra-high resolution can be implemented.

The color conversion layer CCL may include quantum dots QD as a color conversion material that converts light emitted from the emission area EA into light of a specific or given color. For example, the color conversion layer CCL may include quantum dots dispersed in a matrix material such as a base resin.

In an embodiment, each of the light emitting elements LD of the first to third pixels PXL1, PXL2, and PXL3 may include the emission area EA emitting light of a same color. For example, each of the light emitting elements LD of the first to third pixels PXL1, PXL2, and PXL3 may include the emission area EA emitting light of the third color (or blue). The color conversion layer CCL may include the quantum dots that convert blue light emitted from the emission area EA into white light. For example, the color conversion layer CCL may include first quantum dots that converts blue light emitted from the emission area EA into red light and second quantum dots that converts blue light into green light. However, the disclosure is not necessarily limited thereto. In case that the quantum dots are used as the color conversion material, since blue light having a relatively short wavelength in the visible light region is incident on the quantum dots, an absorption coefficient of the quantum dots can be increased. Accordingly, efficiency of the light finally emitted from the pixels PXL can be improved and excellent color reproducibility can be secured. Since the light emitting unit EMU of the first to third pixels PXL1, PXL2, and PXL3 may be formed using the emission area EA of a same color, manufacturing efficiency of the display device can be improved. However, the disclosure is not necessarily limited thereto, and the light emitting elements LD of the first to third pixels PXL1, PXL2, and PXL3 may have emission areas EA emitting light of different colors. For example, the light emitting element LD of the first pixel PXL1 may include the emission area EA of the first color (or red), the light emitting element LD of the second pixel PXL2 may include the emission area EA of the second color (or green), and the light emitting element LD of the third pixel PXL3 may include the emission area EA of the third color (or blue).

The light emitting elements LD described above may be disposed on the first electrode ET1 provided on the substrate SUB. For example, the first semiconductor layer L1 of the light emitting elements LD may be disposed on the first electrode ET1 and electrically connected to the first electrode ET1. The first electrode ET1 may include a metal or a metal oxide. For example, the first electrode ET1 may include copper (Cu), gold (Au), chromium (Cr), titanium (Ti), aluminum (Al), nickel (Ni), indium tin oxide (ITO), and oxides or alloys thereof, but the disclosure is not necessarily limited thereto.

A connection electrode CE may be further disposed between the substrate SUB and the light emitting elements LD. The connection electrode CE may be disposed between the first semiconductor layer L1 of the light emitting elements LD and the first electrode ET1 provided on the substrate SUB. The light emitting elements LD may be electrically connected to the first electrode ET1 provided on the substrate SUB through the connection electrode CE. The connection electrode CE may include a metal or a metal oxide. For example, the connection electrode CE may include copper (Cu), gold (Au), chromium (Cr), titanium (Ti), aluminum (Al), nickel (Ni), indium tin oxide (ITO), and oxides or alloys thereof, but the disclosure is not necessarily limited thereto.

A planarization layer PN and a reflective layer RF may be disposed between the light emitting elements LD. The planarization layer PN may be provided between the light emitting elements LD and the reflective layer RF. The planarization layer PN may serve to planarize steps of the light emitting elements LD. The planarization layer PN may be provided on surfaces of the light emitting elements LD to minimize surface defects of the light emitting elements LD, thereby improving lifespan and luminous efficiency of the light emitting elements LD. For example, the planarization layer PN may be provided on side surfaces of the light emitting elements LD. The planarization layer PN may cover or overlap the side surfaces or side surfaces of the light emitting elements LD and expose upper surfaces of the light emitting element LD. For example, the planarization layer PN may cover or overlap the side surfaces or side surfaces of the light emitting elements LD and expose one surface or a surface of the porous area PA of the light emitting elements LD.

In an embodiment, the planarization layer PN may include an organic material such as acrylates resin, epoxy resin, phenolic resin, polyamides resin, polyimides rein, polyesters resin, polyphenylenesulfides resin, or benzocyclobutene (BCB), but the disclosure is not necessarily limited thereto.

According to an embodiment, the planarization layer PN may include an inorganic material such as silicon oxide ($SiO_x$), silicon nitride ($SiN_x$), silicon oxynitride ($SiO_xN_y$), silicon oxycarbide ($SiO_xC_y$), aluminum oxide ($AlO_x$), aluminum nitride ($AlN_x$), zirconium oxide ($ZrO_x$), hafnium oxide ($HfO_x$), or titanium oxide ($TiO_x$).

The reflective layer RF may be disposed between the light emitting elements LD. The reflective layer RF may be disposed at a boundary of the first to third pixels PXL1, PXL2, and PXL3 on the substrate SUB. The reflective layer RF may be disposed between the light emitting elements LD, and may reflect the light emitted from the light emitting elements LD to improve light output efficiency of the display panel PNL. Also, the reflective layer RF may be disposed at the boundary of the first to third pixels PXL1, PXL2, and PXL3 to prevent color mixing between adjacent pixels PXL. The material of the reflective layer RF is not particularly limited, and may include various reflective materials.

The second electrode ET2 may be disposed on the light emitting elements LD. The second electrode ET2 may be disposed on or directly disposed on the upper surfaces of the light emitting elements LD exposed by the planarization layer PN. For example, the second electrode ET2 may be disposed on or directly disposed on the porous area PA of the light emitting elements LD. The second electrode ET2 may be disposed in the first to third pixels PXL1, PXL2, and PXL3, respectively.

The second electrode ET2 may be formed of various transparent conductive materials. For example, the second electrode ET2 may include at least one of various transparent conductive materials including indium tin oxide (ITO), indium zinc oxide (IZO), indium tin zinc oxide (ITZO), aluminum zinc oxide (AZO), gallium zinc oxide (GZO), zinc tin oxide (ZTO), or gallium tin oxide (GTO), and may be implemented to be substantially transparent or semi-transparent to satisfy a light transmittance. Accordingly, the light emitted from the light emitting elements LD may pass through the second electrode ET2 and be emitted to an outside of the display panel PNL.

A passivation layer PSV may be disposed on the second electrode ET2. The passivation layer PSV may cover or overlap or directly cover or overlap the porous area PA provided with the color conversion layer CCL. The passivation layer PSV may be disposed over the first to third pixels PXL1, PXL2, and PXL3. The passivation layer PSV may prevent impurities such as moisture or air from penetrating from the outside to damage or contaminate the color conversion layer CCL.

In an embodiment, the passivation layer PSV may include an organic material such as acrylates resin, epoxy resin, phenolic resin, polyamides resin, polyimides rein, polyesters resin, polyphenylenesulfides resin, or benzocyclobutene (BCB), but the disclosure is not necessarily limited thereto.

According to an embodiment, the passivation layer PSV may include an inorganic material such as silicon oxide ($SiO_x$), silicon nitride ($SiN_x$), silicon oxynitride ($SiO_xN_y$), silicon oxycarbide ($SiO_xC_y$), aluminum oxide ($AlO_x$), aluminum nitride ($AlN_x$), zirconium oxide ($ZrO_x$), hafnium oxide ($HfO_x$), or titanium oxide ($TiO_x$).

A color filter layer CFL may be disposed on the passivation layer PSV. The color filter layer CFL may be disposed on the light emitting elements LD. For example, the color filter layer CFL may overlap the light emitting elements LD in the third direction (Z-axis direction).

The color filter layer CFL may include color filters CF1, CF2, and CF3 corresponding to the color of each pixel PXL. A full-color image may be displayed by disposing the color filters CF1, CF2, and CF3 corresponding to the colors of the first to third pixels PXL1, PXL2, and PXL3, respectively.

The color filter layer CFL may include a first color filter CF1 disposed in the first pixel PXL1 to selectively transmit light emitted from the first pixel PXL1, a second color filter CF2 disposed in the second pixel PXL2 to selectively transmit light emitted from the second pixel PXL2, and a third color filter CF3 disposed in the third pixel PXL3 to selectively transmit light emitted from the third pixel PXL3.

In an embodiment, the first color filter CF1, the second color filter CF2, and the third color filter CF3 may be a red color filter, a green color filter, and a blue color filter, respectively, but the disclosure is not limited thereto. Hereinafter, in case that arbitrarily referring to any one color filter of the first color filter CF1, the second color filter CF2, and the third color filter CF3, or generically referring to two or more types of color filters, "color filter CF" or "color filters CF" can be used.

The first color filter CF1 may overlap the light emitting element LD of the first pixel PXL1 in the third direction (Z-axis direction). The first color filter CF1 may include a color filter material that selectively transmits light of the first color (or red). For example, in case that the first pixel PXL1 is the red pixel, the first color filter CF1 may include a red color filter material.

The second color filter CF2 may overlap the light emitting element LD of the second pixel PXL2 in the third direction (Z-axis direction). The second color filter CF2 may include a color filter material that selectively transmits light of the second color (or green). For example, in case that the second pixel PXL2 is the green pixel, the second color filter CF2 may include a green color filter material.

The third color filter CF3 may overlap the light emitting element LD of the third pixel PXL3 in the third direction (Z-axis direction). The third color filter CF3 may include a color filter material that selectively transmits light of the third color (or blue). For example, in case that the third pixel PXL3 is the blue pixel, the third color filter CF3 may include a blue color filter material.

According to the above-described embodiments, the scattering area SA and the color conversion area CA may be embedded in the porous area PA of the light emitting elements LD. Therefore, the light output efficiency of the display panel PNL can be improved, a manufacturing process can be simplified, and a display device having an ultra-high resolution can be implemented.

Hereinafter, an embodiment will be described. In the following embodiment, components that are the same as those already described are referred to by the same reference numerals, and duplicate descriptions thereof will be omitted or simplified.

Figure 4:
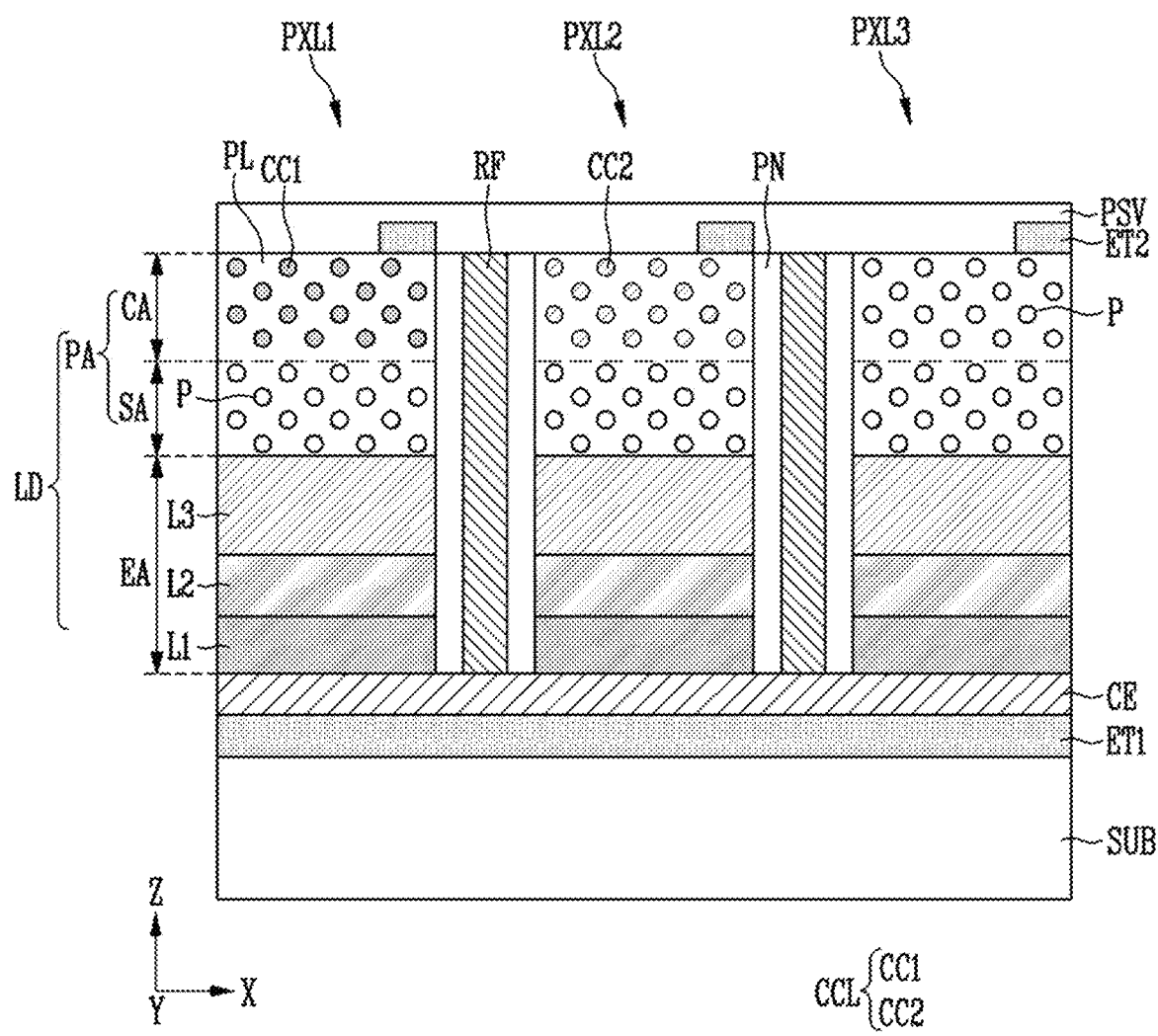
FIG. 4 is a schematic cross-sectional view illustrating a pixel according to an embodiment.

FIG. 4 is a schematic cross-sectional view illustrating a pixel according to an embodiment.

Referring to FIG. 4, in a display device according to an embodiment, the color conversion layer CCL may include a first color conversion layer CC1 disposed on the first pixel PXL1 and a second color conversion layer CC2 disposed on the second pixel PXL2. An embodiment may be distinguished from the embodiment of FIGS. 1 to 3 in that the color filter layer CFL is omitted.

In an embodiment, each of the light emitting elements LD of the first to third pixels PXL1, PXL2, and PXL3 may include the emission area EA emitting light of a same color. For example, each of the light emitting elements LD of the first to third pixels PXL1, PXL2, and PXL3 may include the emission area EA emitting light of the third color (or blue).

Each of the first color conversion layer CC1 and the second color conversion layer CC2 may include quantum dots as a color conversion material that converts light of the third color (or blue) emitted from the emission area EA into light of a specific or given color. For example, each of the first color conversion layer CC1 and the second color conversion layer CC2 may include quantum dots dispersed in a matrix material such as a base resin.

The first color conversion layer CC1 may be provided in the pores P of the color conversion area CA of the first pixel PXL1. In an embodiment, in case that the first pixel PXL1 is the red pixel, the first color conversion layer CC1 may include first quantum dots that converts blue light emitted from the emission area EA into red light. The first quantum dots may absorb blue light and shift a wavelength according to energy transition to emit red light. In case that the first pixel PXL1 is a pixel of a different color, the first color conversion layer CC1 may include first quantum dots corresponding to the color of the first pixel PXL1.

The second color conversion layer CCL2 may be provided in the pores P of the color conversion area CA of the second pixel PXL2. In an embodiment, in case that the second pixel PXL2 is the green pixel, the second color conversion layer CC2 may include second quantum dots that converts blue light emitted from the emission area EA into green light. The second quantum dots may absorb blue light and shift a wavelength according to energy transition to emit green light. In case that the second pixel PXL2 is a pixel of a different color, the second color conversion layer CC2 may include second quantum dots corresponding to the color of the second pixel PXL2.

In an embodiment, in case that the third pixel PXL3 is the blue pixel, the first color conversion layer CC1 and/or the second color conversion layer CC2 may be omitted from the third pixel PXL3. Accordingly, since blue light emitted from the emission area EA may be scattered by the pores P of the color conversion area CA of the third pixel PXL3, light extraction efficiency can be increased.

In an embodiment, since blue light having a relatively short wavelength in the visible light region is incident on the first quantum dots and the second quantum dots, respectively, absorption coefficients of the first quantum dots and the second quantum dots can be increased. Accordingly, efficiency of the light finally emitted from the first pixel PXL1 and the second pixel PXL2 can be improved, and excellent color reproducibility can be secured. Since the light emitting unit EMU of the first to third pixels PXL1, PXL2, and PXL3 may be formed using the emission area EA of a same color, manufacturing efficiency of the display device can be improved.

According to the above-described embodiments, as described above, the scattering area SA and the color conversion area CA may be embedded in the porous area PA of the light emitting elements LD. Therefore, the light output efficiency of the display panel PNL can be improved, a manufacturing process can be simplified, and a display device having an ultra-high resolution can be implemented.

Subsequently, a method of manufacturing the display device according to the above-described embodiments will be described.

FIGS. 5 to 14 are schematic cross-sectional views illustrating process steps for explaining a method of manufacturing a display device according to an embodiment. FIGS. 5 to 14 are schematic cross-sectional views for explaining a method of manufacturing the display device of FIG. 3. Components substantially the same as those shown in FIG. 3 are denoted by the same reference numerals and detailed reference numerals are omitted.

Figure 5:
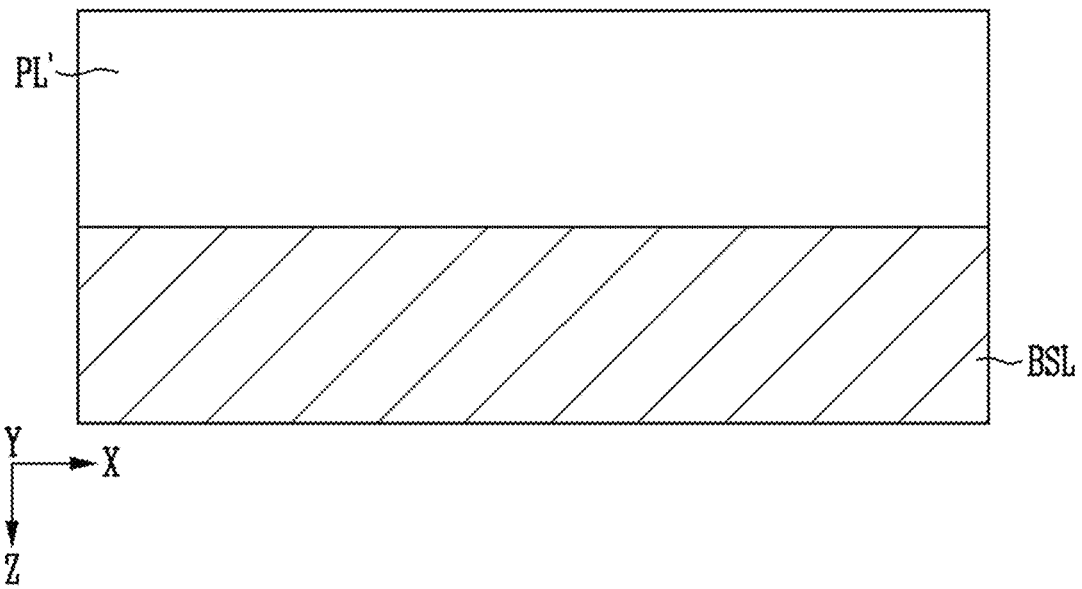
FIGS. 5 to 14 are schematic cross-sectional views illustrating process steps for explaining a method of manufacturing a display device according to an embodiment.

Referring to FIG. 5, first, a base layer BSL may be prepared, and a semiconductor layer PL' may be formed on the base layer BSL. The base layer BSL may be a sapphire substrate, a silicon (Si) substrate, or a silicon carbide (SiC)

substrate, but the disclosure is not limited thereto. The base layer BSL may be a single crystal substrate having a lattice structure. The base layer BSL may further include a buffer layer formed on one surface or a surface.

The semiconductor layer PL' may include at least one n-type semiconductor layer. For example, the semiconductor layer PL' may include a semiconductor material such as GaN, InGaN, InAlGaN, AlGaN, or AlN, and may be an n-type semiconductor layer doped with a second conductive dopant (or an n-type dopant) such as Si, Ge, Sn, or the like within the spirit and the scope of the disclosure. For example, the semiconductor layer PL' may include a GaN semiconductor material doped with the second conductive dopant (or the n-type dopant). However, the material constituting the semiconductor layer PL' is not limited thereto, and various other materials may be used to form the semiconductor layer PL'.

Figure 6:
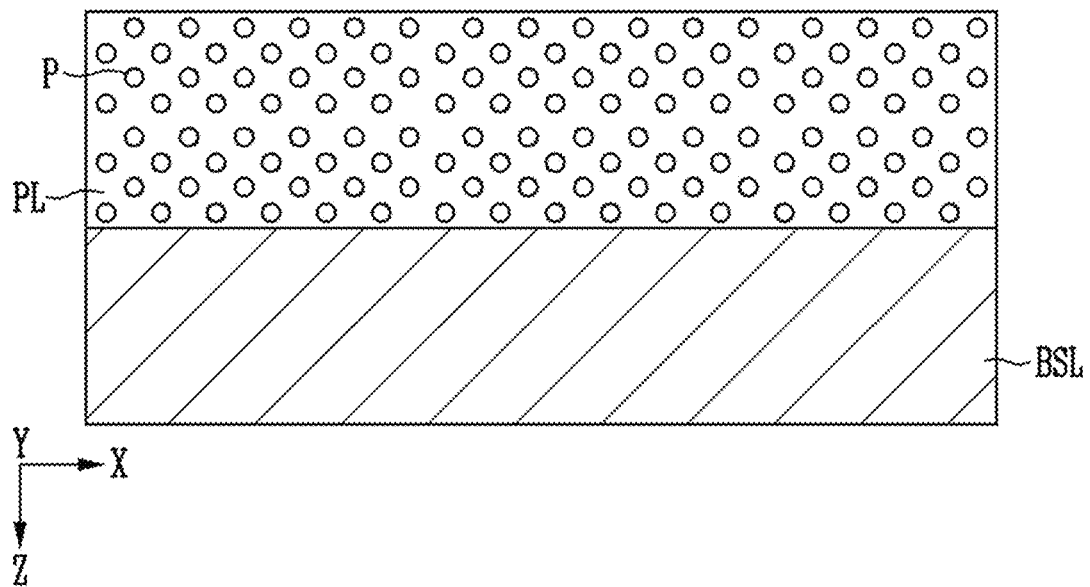

Referring to FIG. 6, subsequently, the semiconductor layer PL' may be etched to form a porous layer PL. For example, nanoscale pores P may be formed in the porous layer PL by electrochemical etching the semiconductor layer PL'. In a process of electrochemical etching the semiconductor layer PL', the size, shape, and distribution of the pores P may be variously adjusted according to an etchant, a voltage, and/or a doping concentration. For example, the size, shape, and distribution of the pores P may be adjusted differently depending on a scattering area SA and a color conversion area CA embedded in light emitting elements LD. For example, the size of the pores P formed in the porous layer PL corresponding to the color conversion area CA of the light emitting elements LD may be larger than the size of the pores P formed in the porous layer PL corresponding to the scattering area SA. In a subsequent process, a color conversion layer CCL may be selectively injected into the pores P of the color conversion area CA. However, the disclosure is not necessarily limited thereto, and the pores P formed in the porous layer PL corresponding to the color conversion area CA may be formed to have substantially a same size and shape as the pores P formed in the porous layer PL corresponding to the scattering area SA.

Figure 7:
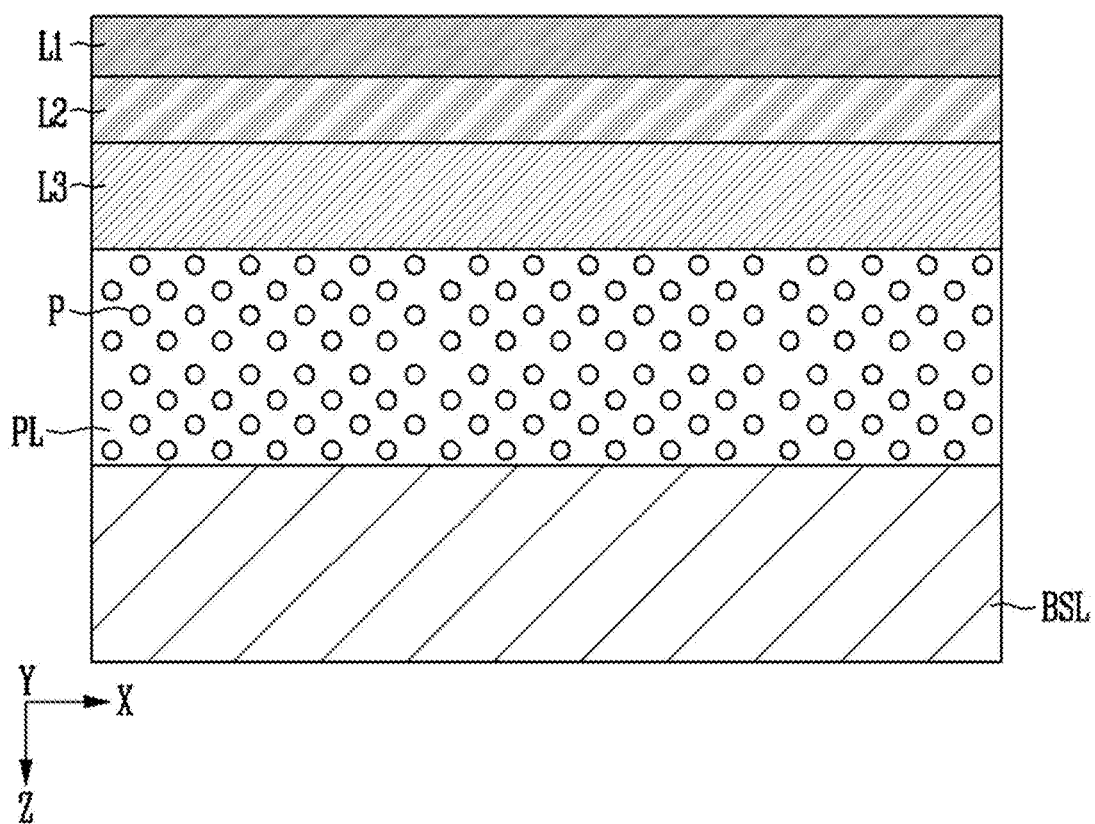

Referring to FIG. 7, subsequently, light emitting stacks L1, L2, and L3 may be formed on the porous layer PL. The light emitting stacks L1, L2, and L3 may be formed by growing seed crystals using an epitaxial method. According to an embodiment, the light emitting stacks L1, L2, and L3 may be formed by a metal organic chemical vapor deposition (MOCVD) method. However, the disclosure is not necessarily limited thereto. The light emitting stacks L1, L2, and L3 may be formed by various methods such as an electron beam deposition method, a physical vapor deposition (PVD) method, a chemical vapor deposition (CVD) method, a plasma laser deposition (PLD) method, a dual-type thermal evaporation method, a sputtering method, a metal organic chemical vapor deposition (MOCVD) method, and the like within the spirit and the scope of the disclosure.

The light emitting stacks L1, L2, and L3 may include a first semiconductor layer L1, an active layer L2, and a second semiconductor layer L3 which are epitaxially grown.

The second semiconductor layer L3 may be provided on the porous layer PL and may be formed of a same material or similar material as the porous layer PL. For example, the second semiconductor layer L3 may include at least one n-type semiconductor layer. For example, the second semiconductor layer L3 may include a semiconductor material of any one of GaN, InGaN, InAlGaN, AlGaN, and AlN, and may be an n-type semiconductor layer doped with the second conductive dopant (or the n-type dopant) such as Si, Ge, Sn, or the like within the spirit and the scope of the disclosure. For example, the second semiconductor layer L3 may include a GaN semiconductor material doped with the second conductive dopant (or the n-type dopant). However, the material constituting the second semiconductor layer L3 is not limited thereto, and various other materials may be used to form the second semiconductor layer L3. The second semiconductor layer L3 may be formed on or directly formed on the porous layer PL, but the disclosure is not limited thereto.

The active layer L2 may be disposed between the first semiconductor layer L1 and the second semiconductor layer L3. The active layer L2 may include any one of a single well structure, a multi-well structure, a single quantum well structure, a multi quantum well (MQW) structure, a quantum dot structure, or a quantum wire structure, but the disclosure is limited thereto. The active layer L2 may include AlGaN, InGaN, or GaN, and various other materials may be used to form the active layer L2.

The first semiconductor layer L1 may be provided on the active layer L2 and may include at least one p-type semiconductor layer. For example, the first semiconductor layer L1 may include a semiconductor material such as GaN, InGaN, InAlGaN, AlGaN, or AlN, and may include a p-type semiconductor layer doped with a first conductivity (or a p-type dopant) such as Mg, Zn, Ca, Sr, Ba, or the like within the spirit and the scope of the disclosure. For example, the first semiconductor layer L1 may include a GaN semiconductor material doped with the first conductive dopant (or the p-type dopant). However, the disclosure is not necessarily limited thereto, and various other materials may be used to form the first semiconductor layer L1.

Figure 8:
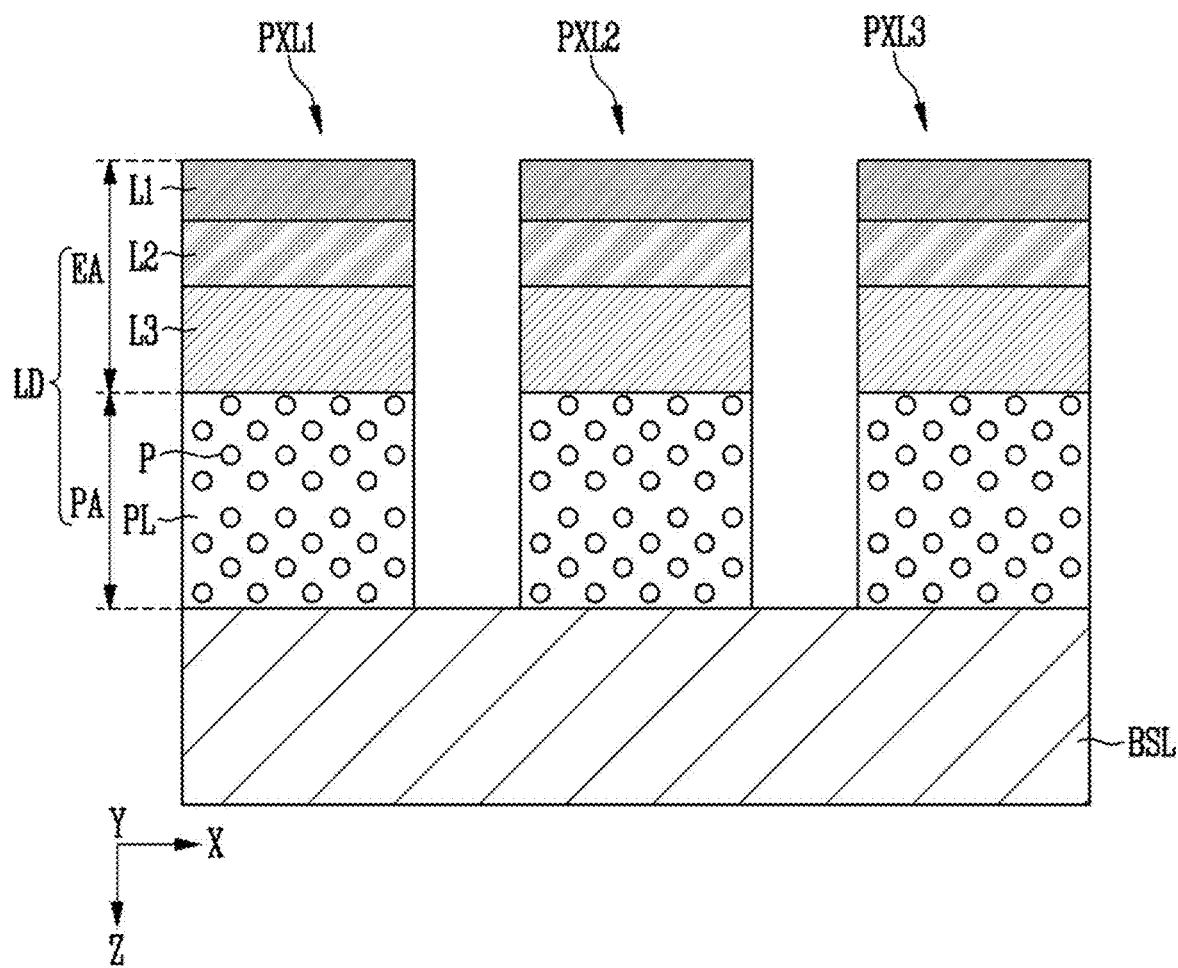

Referring to FIG. 8, subsequently, the porous layer PL and the light emitting stacks L1, L2, and L3 may be patterned to form the light emitting elements LD. The light emitting elements LD may be formed in each of the first to third pixels PXL1, PXL2, and PXL3. The porous layer PL may constitute a porous area PA of the light emitting elements LD. The light emitting stacks L1, L2, and L3 may constitute an emission area EA of the light emitting elements LD.

Figure 9:
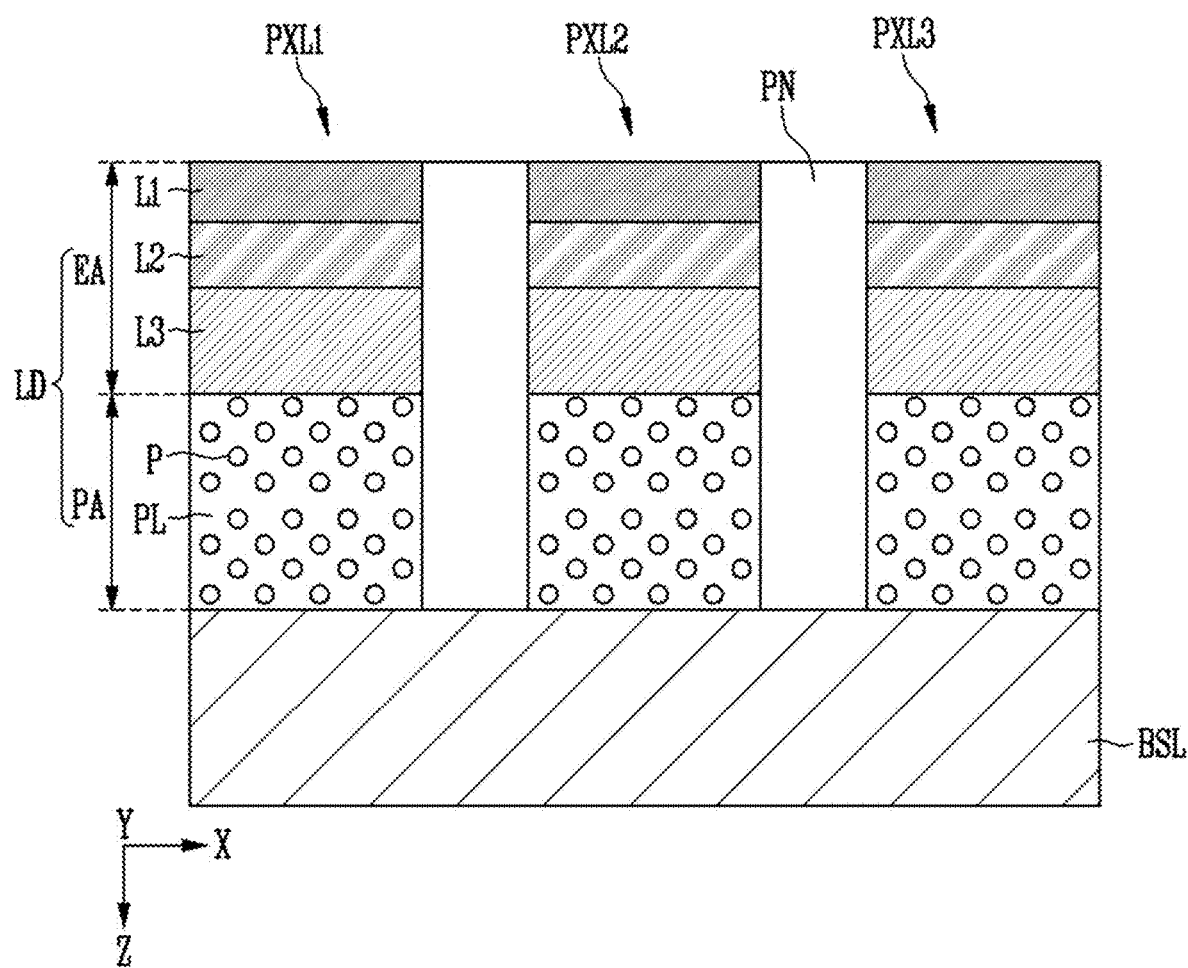

Referring to FIG. 9, subsequently, a planarization layer PN may be formed between the light emitting elements LD. The planarization layer PN may be formed at a boundary of the first to third pixels PXL1, PXL2, and PXL3. The planarization layer PN may be formed between the light emitting elements LD and may serve to planarize steps of the light emitting elements LD. The planarization layer PN may be formed on side surfaces of the light emitting elements LD. For example, the planarization layer PN may cover or overlap the side surfaces or side surfaces of the light emitting elements LD, and expose upper surfaces of the light emitting elements LD.

In an embodiment, the planarization layer PN may be formed of an organic material such as acrylates resin, epoxy resin, phenolic resin, polyamides resin, polyimides rein, polyesters resin, polyphenylenesulfides resin, or benzocyclobutene (BCB), but the disclosure is not necessarily limited thereto.

According to an embodiment, the planarization layer PN may be formed of an inorganic material such as silicon oxide ($SiO_x$), silicon nitride ($SiN_x$), silicon oxynitride ($SiO_xN_y$), silicon oxycarbide ($SiO_xC_y$), aluminum oxide ($AlO_x$), aluminum nitride ($AlN_x$), zirconium oxide ($ZrO_x$), hafnium oxide ($HfO_x$), or titanium oxide ($TiO_x$).

Figure 10:
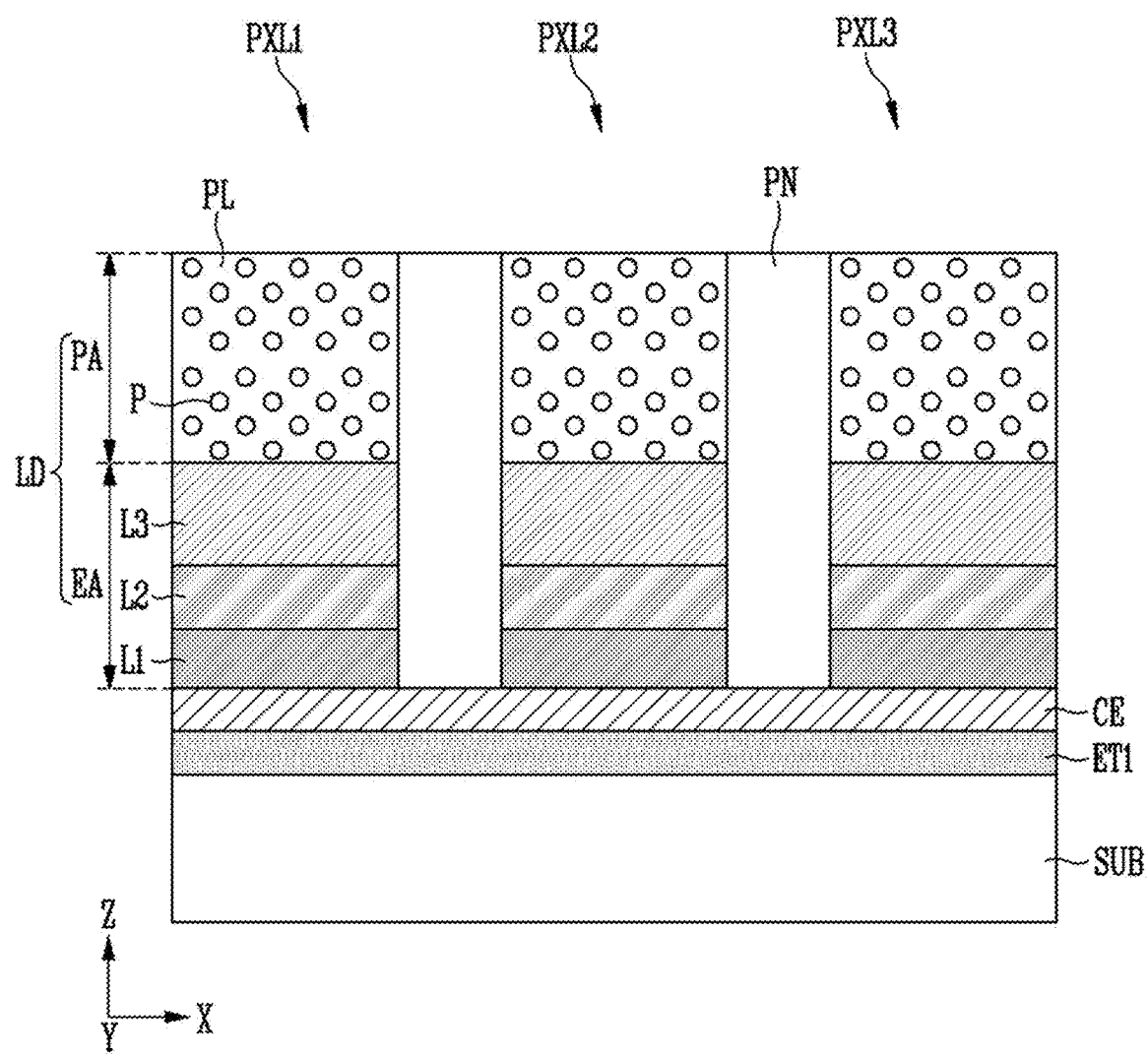

Referring to FIG. 10, subsequently, the light emitting elements LD may be connected or coupled to a substrate SUB. The substrate SUB may be a driving substrate including circuit elements including transistors constituting the pixel circuit PXC of each pixel PXL shown in FIG. 2.

The first semiconductor layer L1 of the light emitting elements LD may be connected or coupled to a first electrode ET1 formed on the substrate SUB. A connection electrode CE for bonding may be provided between the light emitting elements LD and the substrate SUB. The connection electrode CE may be provided between the first semiconductor layer L1 of the light emitting elements LD and the first electrode ET1 provided on the substrate SUB. The light emitting elements LD may be readily bonded to the first electrode ET1 provided on the substrate SUB through the connection electrode CE. The connection electrode CE may be formed of a metal or a metal oxide. For example, the connection electrode CE may be formed of copper (Cu), gold (Au), chromium (Cr), titanium (Ti), aluminum (Al), nickel (Ni), indium tin oxide (ITO), and oxides or alloys thereof, but the disclosure is not necessarily limited thereto.

After the light emitting elements LD are connected or coupled to the substrate SUB, the base layer BSL may be separated from one surface or a surface of the porous layer PL.

Figure 11:
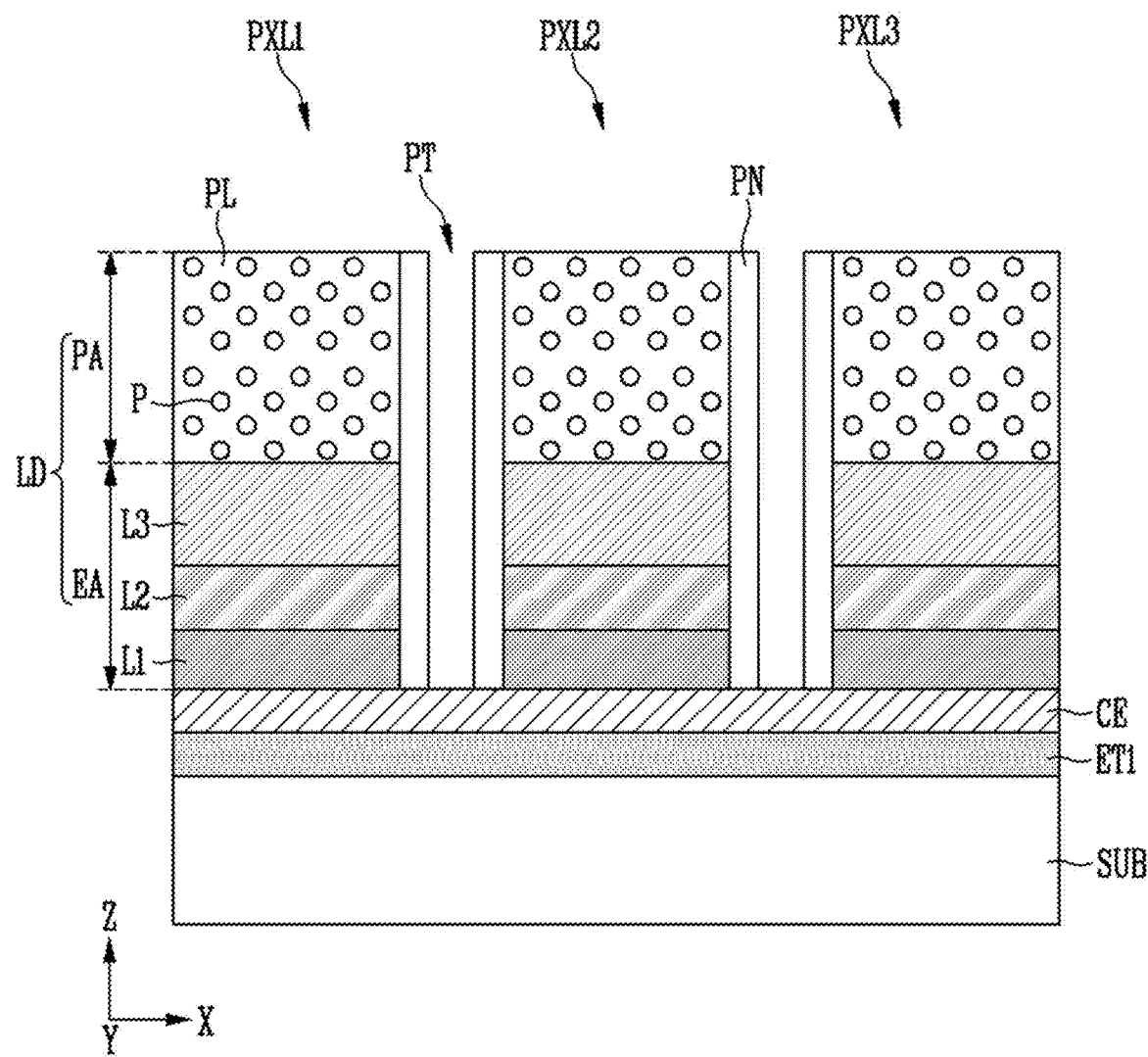

Referring to FIG. 11, subsequently, the planarization layer PN may be patterned to form groove patterns PT. The groove patterns PT may be formed between the light emitting elements LD. For example, the groove patterns PT may be formed at the boundary of the first to third pixels PXL1, PXL2, and PXL3.

Figure 12:
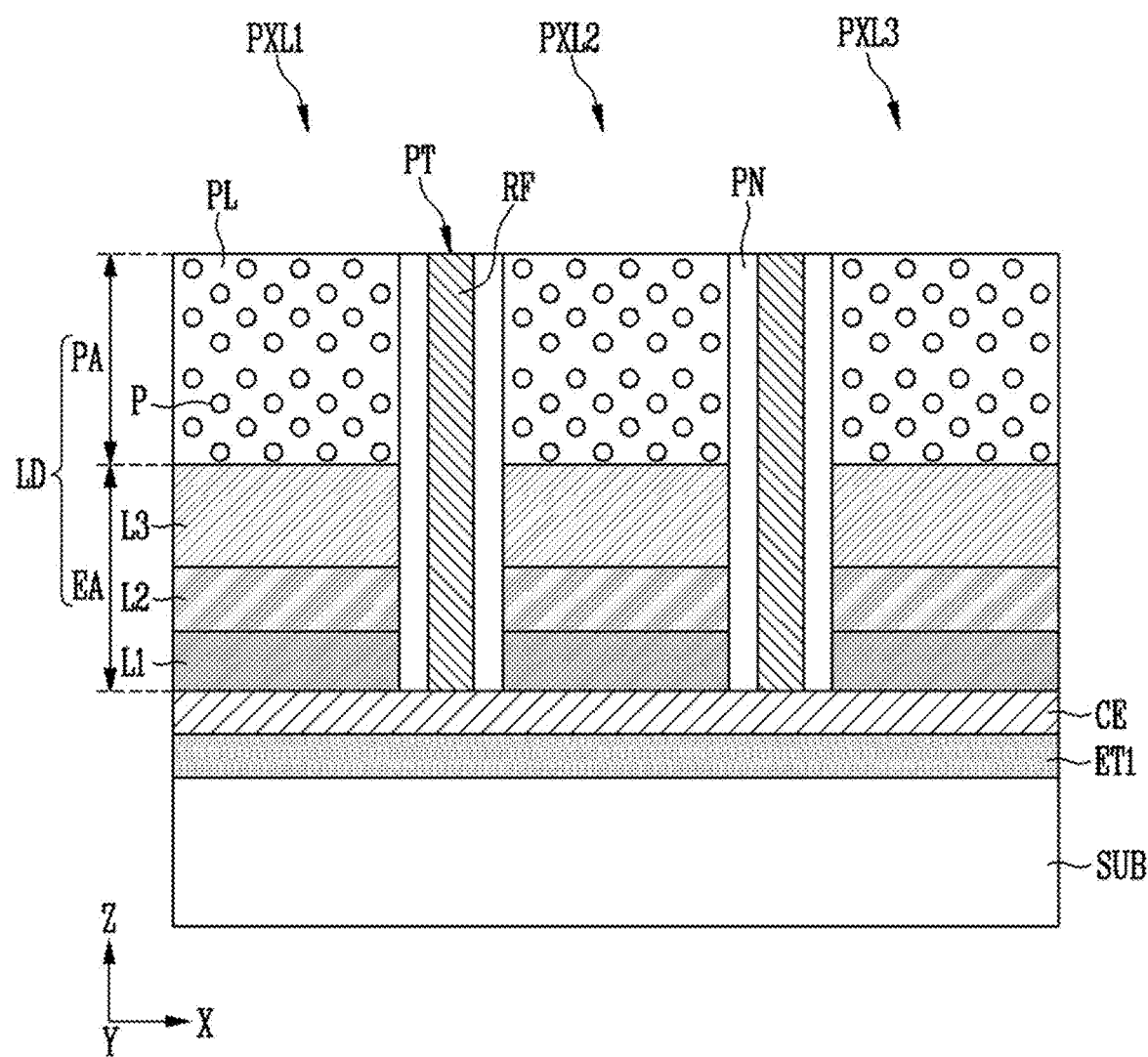

Referring to FIG. 12, subsequently, a reflective layer RF may be formed in the groove patterns PT of the planarization layer PN. The reflective layer RF may reflect light emitted from the light emitting elements LD to improve light output efficiency of the display panel PNL. Also, the reflective layer RF may be formed at the boundary of the first to third pixels PXL1, PXL2, and PXL3 to prevent color mixing between adjacent pixels PXL. The material of the reflective layer RF is not particularly limited and may be formed of various reflective materials.

Figure 13:
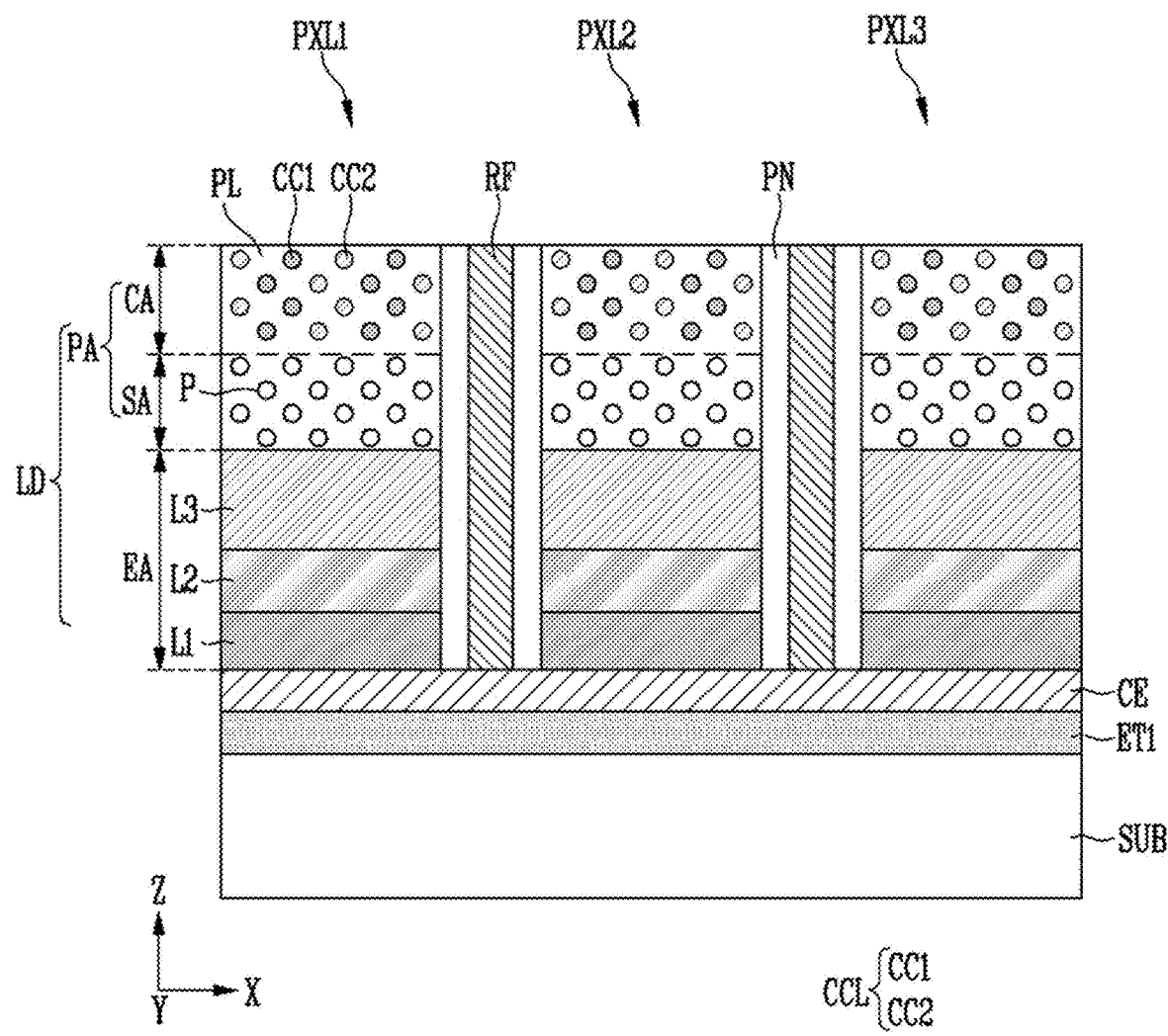

Referring to FIG. 13, subsequently, the color conversion area CA may be formed by providing the color conversion layer CCL in the porous layer PL. The color conversion layer CCL may be injected into the pores P of the color conversion area CA. As such, in case that the color conversion layer CCL, for example, the color conversion area CA, may be embedded in the porous area PA of the light emitting elements LD, the color conversion layer separately provided on the light emitting elements LD may be omitted. Accordingly, as described above, since a barrier rib structure provided at a boundary of the pixels PXL to form the color conversion layer may be omitted, a manufacturing process can be simplified and a display device having an ultra-high resolution can be implemented. The color conversion layer CCL may include quantum dots as a color conversion material that converts light emitted from the emission area EA into light of a specific or given color. Since the color conversion layer CCL has been described in detail with reference to FIG. 3 and the like, duplicate descriptions will be omitted.

In the porous area PA, an area in which the color conversion layer CCL is not provided in the pores P may be divided into the scattering area SA. The pores P of the scattering area SA may scatter the light emitted from the emission area EA to improve light output efficiency. For example, since a refractive index in the scattering area SA is reduced by pores P, light extraction efficiency can be increased. As such, in case that the scattering area SA is embedded in the porous area PA of the light emitting elements LD, since a scattering layer separately provided in the pixel PXL may be omitted, a manufacturing process can be simplified and a manufacturing cost can be reduced. As described above, the scattering area SA may be provided between the emission area EA and the color conversion area CA, and may effectively prevent the color conversion layer CCL provided in the color conversion area CA from being damaged by heat generated in the emission area EA.

Figure 14:
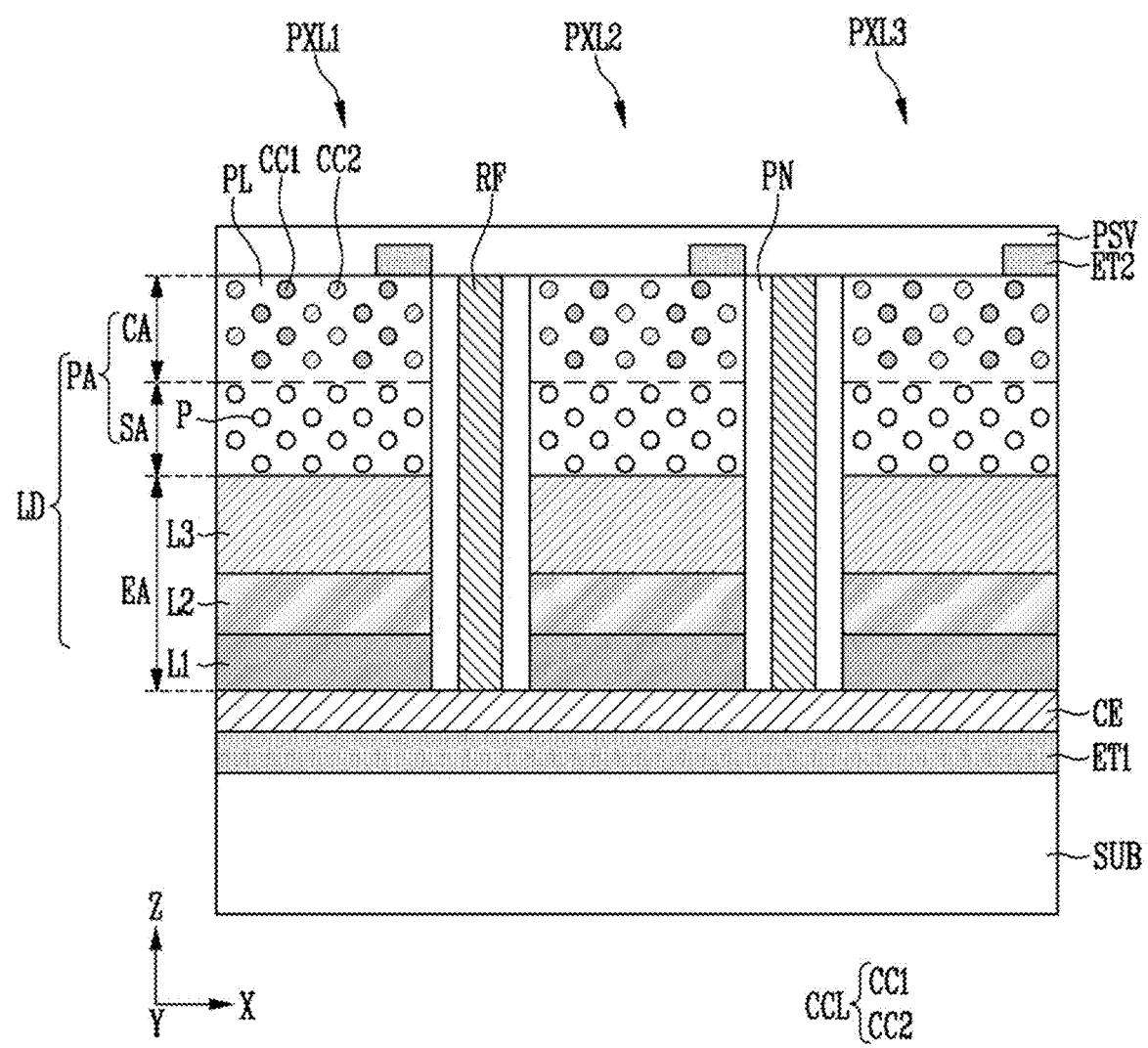

Referring to FIG. 14, subsequently, a second electrode ET2 and a passivation layer PSV may be formed on the light emitting elements LD. The second electrode ET2 may be formed on or directly formed on the upper surfaces of the light emitting elements LD exposed by the planarization layer PN. For example, the second electrode ET2 may be formed on or directly formed on the porous area PA of the light emitting elements LD. The second electrode ET2 may be formed in each of the first to third pixels PXL1, PXL2, and PXL3.

The passivation layer PSV may be formed on the second electrode ET2. The passivation layer PSV may cover or overlap or directly cover or overlap the porous area PA provided with the color conversion layer CCL. The passivation layer PSV may be disposed over the first to third pixels PXL1, PXL2, and PXL3. The passivation layer PSV may prevent impurities such as moisture or air from penetrating from an outside to damage or contaminate the color conversion layer CCL.

Subsequently, the display device of FIG. 3 may be completed by forming a color filter layer CFL on the passivation layer PSV. The color filter layer CFL may include color filters CF1, CF2, and CF3 corresponding to the color of each pixel PXL. Since the color filter layer CFL has been described in detail with reference to FIG. 3 and the like, duplicate descriptions thereof will be omitted.

According to the above-described embodiments, the scattering area SA and the color conversion area CA may be embedded in the porous area PA of the light emitting elements LD. Therefore, light output efficiency of the display panel PNL can be improved, a manufacturing process can be simplified, and a display device having an ultra-high resolution can be implemented.

Hereinafter, electronic devices to which the display device of the above-described embodiments can be applied will be described.

FIGS. 15 to 18 are schematic diagrams illustrating examples of electronic devices according to various embodiments.

Figure 15:
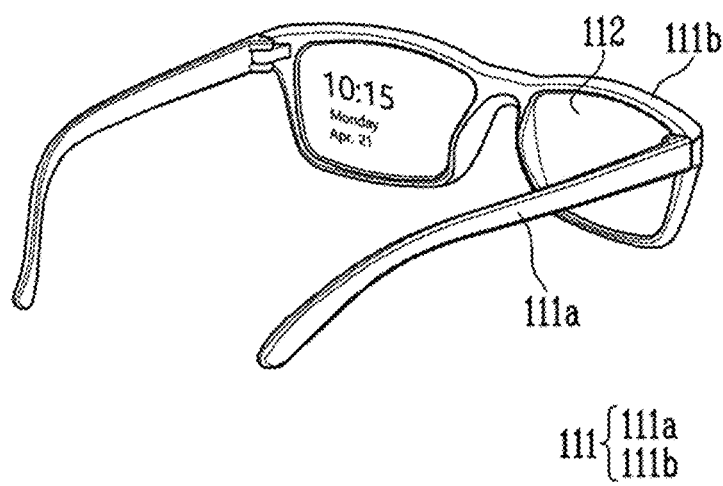
FIGS. 15 to 18 are schematic diagrams illustrating examples of electronic devices according to various embodiments.

Referring to FIG. 15, the display device according to the above-described embodiments may be applied to smart glasses. The smart glasses may include a frame 111 and a lens or lens unit 112. The smart glasses may be wearable electronic devices that can be worn on a user's face, and may have a structure in which a part of the frame 111 is folded or unfolded. For example, the smart glasses may be a wearable device for augmented reality (AR).

The frame 111 may include a housing 111*b* supporting the lens unit 112 and a leg or leg unit 111*a* for wearing by a user. The leg unit 111*a* may be connected to the housing 111*b* by a hinge and may be folded or unfolded.

A battery, a touch pad, a microphone, and/or a camera may be embedded in the frame 111. A projector for outputting light and/or a processor for controlling an optical signal and the like may be embedded in the frame 111.

The lens unit 112 may be an optical member that transmits light or reflects light. The lens unit 112 may include glass and/or a transparent synthetic resin.

The display device according to the above-described embodiments may be applied to the lens unit 112. For example, the user may recognize an image displayed by the optical signal transmitted from the projector of the frame 111 through the lens unit 112. For example, the user may recognize information about time, date, and the like displayed on the lens unit 112.

Figure 16:
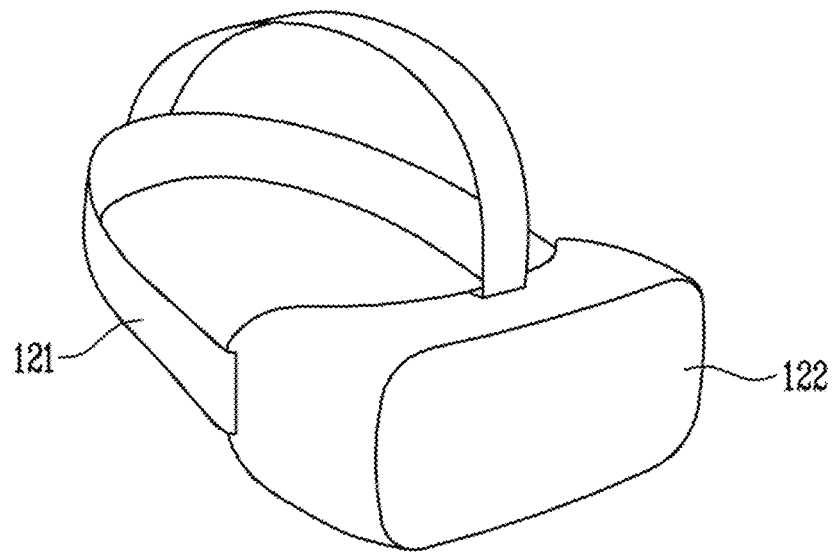

Referring to FIG. 16, the display device according to the above-described embodiments may be applied to a head mounted display (HMD). The head mounted display may include a head mounting band 121 and a display storage case 122. For example, the head mounted display may be a wearable electronic device that can be worn on a user's head.

The head mounting band 121 may be connected to the display storage case 122 to fix the display storage case 122. The head mounting band 121 may include a horizontal band and a vertical band to secure the head mounted display to the user's head, as shown in FIG. 16. The horizontal band may be provided to surround a side of the user's head, and the vertical band may be provided to surround an upper portion of the user's head. However, the disclosure is not necessarily limited thereto, and the head mounting band 121 may be implemented in the form of an eyeglass frame or a helmet.

The display storage case 122 may accommodate the display device and may include at least one lens. At least one lens may provide an image to a user. For example, the display device according to the above-described embodiments may be applied to a left eye lens and a right eye lens implemented in the display storage case 122.

Figure 17:
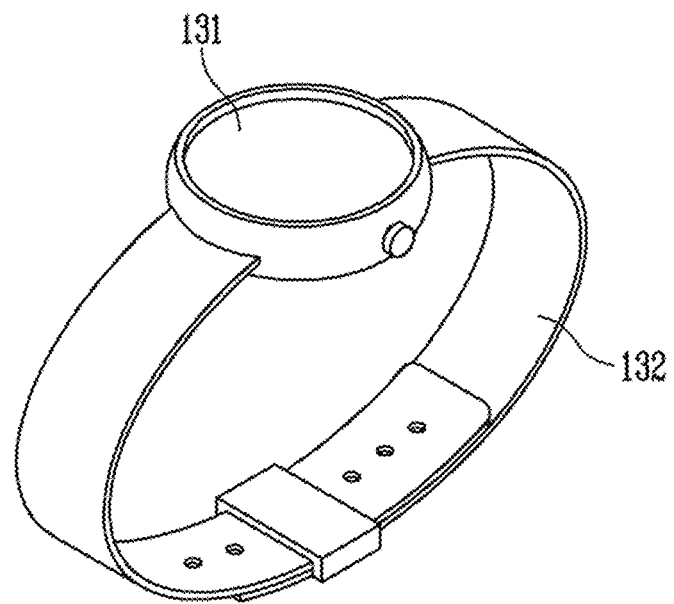

Referring to FIG. 17, the display device according to the above-described embodiments may be applied to a smart watch. The smart watch may include a display or display unit 131 and a strap unit 132. The smart watch may be a wearable electronic device, and the strap unit 132 may be mounted on a user's wrist. The display device according to the above-described embodiments may be applied to the display unit 131. For example, the display unit 131 may provide image data including information on time, date, and the like within the spirit and the scope of the disclosure.

Figure 18:
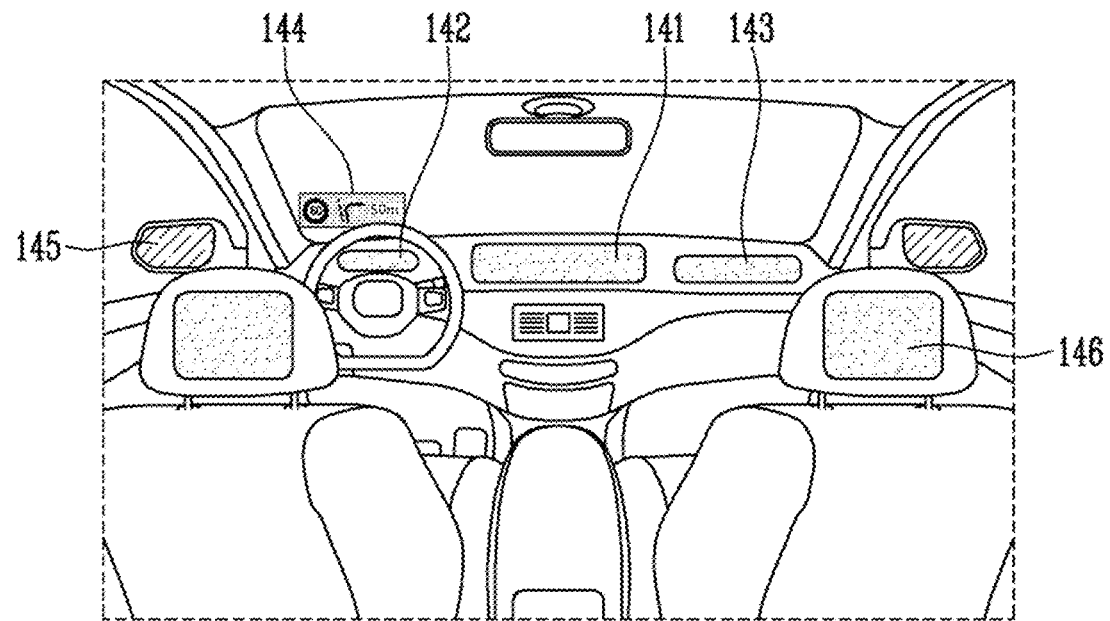

Referring to FIG. 18, the display device according to the above-described embodiments may be applied to an automotive display. For example, the automotive display may refer to an electronic device provided inside and outside a vehicle to provide image data.

For example, the display device according to the above-described embodiments may be applied to at least one of an infotainment panel 141, a cluster 142, a co-driver display 143, a head-up display 144, a side mirror display 145, and a rear seat display 146 provided in the vehicle.

According to embodiments, the scattering area and the color conversion area may be embedded in the porous area of the light emitting elements. Therefore, light output efficiency of the display panel can be improved, a manufacturing process can be simplified, and a display device having an ultra-high resolution can be implemented.

The effects according to embodiments disclosure are not limited by the contents disclosed above, and other various effects are included in the disclosure.

Those skilled in the art will appreciate that various modifications and equivalent embodiments are possible within the spirit and the scope of the disclosure. Therefore, it is to be understood that the embodiments as described above have been disclosed for illustrative purposes only and are not intended to limit the scope of the disclosure. The scope of the disclosure should be determined by the appended claims, in addition to the foregoing description. All changes or modifications derived from the meaning and scope of the claims and their equivalent concepts should be construed as being included in the scope of the disclosure.

What is claimed is:

1. A display device comprising:
   light emitting elements disposed on a substrate, wherein the light emitting elements include:
     a plurality of emission members; and
     a plurality of porous members overlapping the plurality of emission members, respectively, the plurality of porous members include:
       a plurality of color conversion layers including porous portions with quantum dots; and
   a plurality of scattering lavers excluding the plurality of color conversion layers and including porous portions without the quantum dots and being unfilled or empty,
   the plurality of scattering layers are disposed between the plurality of emission members and the plurality of color conversion lavers, respectively, and are spaced apart from each other.

2. The display device of claim 1, wherein the light emitting elements include:
   a first semiconductor layer,
   a second semiconductor layer, the first semiconductor layer and the second semiconductor layer being disposed in the plurality of emission members of the light emitting elements, and
   an active layer disposed between the first semiconductor layer and the second semiconductor layer.

3. The display device of claim 2, wherein the plurality of porous members and the second semiconductor layer include a same material.

4. The display device of claim 1, wherein the porous portions of the plurality of color conversion layers include nanoscale pores.

5. The display device of claim 4, wherein the quantum dots are disposed inside the nanoscale pores having a cavity or a non-solid.

6. The display device of claim 1, further comprising:
   a color filter layer disposed on the light emitting elements.

7. The display device of claim 1, further comprising:
   a reflective layer disposed between the light emitting elements.

8. The display device of claim 7, further comprising:
   a planarization layer disposed between the light emitting elements and the reflective layer.

9. The display device of claim 1, wherein the porous portions of the plurality of color conversion layers and the porous portions of the plurality of scattering layers are different sizes from each other.

10. The display device of claim 1, wherein the porous portions of the plurality of color conversion layers and the porous portions of the plurality of scattering layers are same as each other.

* * * * *